United States Patent
Kim et al.

(10) Patent No.: US 10,540,938 B2
(45) Date of Patent: Jan. 21, 2020

(54) SHIFT-BUFFER CIRCUIT, GATE DRIVING CIRCUIT, DISPLAY PANEL AND DRIVING METHOD

(71) Applicant: BOE TECHNOLOGY GROUP CO., LTD., Beijing (CN)

(72) Inventors: Jiha Kim, Beijing (CN); Seung Woo Han, Beijing (CN); Guangliang Shang, Beijing (CN); Xing Yao, Beijing (CN); Haoliang Zheng, Beijing (CN); Mingfu Han, Beijing (CN); Zhichong Wang, Beijing (CN); Lijun Yuan, Beijing (CN); Yun Sik Im, Beijing (CN); Jing Lv, Beijing (CN); Yinglong Huang, Beijing (CN); Xue Dong, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/768,948

(22) PCT Filed: Oct. 17, 2017

(86) PCT No.: PCT/CN2017/106517
§ 371 (c)(1),
(2) Date: Apr. 17, 2018

(87) PCT Pub. No.: WO2018/184372
PCT Pub. Date: Oct. 11, 2018

(65) Prior Publication Data
US 2019/0057638 A1 Feb. 21, 2019

(30) Foreign Application Priority Data
Apr. 5, 2017 (CN) .......................... 2017 1 0218273

(51) Int. Cl.
*G09G 3/36* (2006.01)
*G11C 19/28* (2006.01)
(Continued)

(52) U.S. Cl.
CPC ............. *G09G 3/3677* (2013.01); *G09G 3/20* (2013.01); *G09G 3/3266* (2013.01);
(Continued)

(58) Field of Classification Search
CPC ...... G09G 3/20; G09G 3/3266; G09G 3/3674; G09G 3/3677; G09G 2300/0408;
(Continued)

(56) References Cited

U.S. PATENT DOCUMENTS 8,325,127 B2 * 12/2012 Chang ................. G09G 3/3677
345/100
9,024,676 B2 * 5/2015 Ofuji .................... H03K 17/005
327/365
(Continued)

FOREIGN PATENT DOCUMENTS

CN    102226940 A    10/2011
CN    104835476 A    8/2015
(Continued)

OTHER PUBLICATIONS

International Search Report of PCT/CN2017/106517 in Chinese, dated Jan. 16, 2018 with English translation.
(Continued)

Primary Examiner — Patrick O Neill
(74) Attorney, Agent, or Firm — Collard & Roe, P.C.

(57) ABSTRACT

A shift-buffer circuit, a gate driving circuit, a display panel, a display device, and a driving method. The shift-buffer circuit includes: a shift register and a plurality of buffers connected with the shift register. The shift register includes a shift output terminal; the shift register is configured to output a shift output signal from the shift output terminal, in response to a shift clock signal; each of the buffers includes a buffer input terminal and a buffer output terminal, the buffer input terminal being connected with the shift output terminal; each of the buffers is configured to output a buffer output signal from the buffer output terminal, in response to a buffer clock signal.

18 Claims, 12 Drawing Sheets

(51) Int. Cl.
*G09G 3/3266* (2016.01)
*G09G 3/20* (2006.01)
*G11C 19/18* (2006.01)

(52) U.S. Cl.
CPC ............ *G11C 19/184* (2013.01); *G11C 19/28* (2013.01); *G09G 2300/0408* (2013.01); *G09G 2310/0267* (2013.01); *G09G 2310/0286* (2013.01); *G09G 2310/0291* (2013.01)

(58) Field of Classification Search
CPC ... G09G 2310/0286; G09G 2310/0291; G11C 19/28; G11C 19/287
See application file for complete search history.

(56) References Cited

U.S. PATENT DOCUMENTS

| | | | | |
|---|---|---|---|---|
| 9,330,782 B2* | 5/2016 | Yamamoto | ............ | G09G 3/3677 |
| 9,626,895 B2* | 4/2017 | Tsai | ............ | G09G 3/2092 |
| 9,786,241 B2* | 10/2017 | Du | ............ | G09G 3/3677 |
| 9,886,921 B2* | 2/2018 | Chen | ............ | G09G 3/3611 |
| 10,074,330 B2* | 9/2018 | Tseng | ............ | G09G 3/3677 |
| 10,236,073 B2* | 3/2019 | Feng | ............ | G09G 3/3677 |
| 2009/0278785 A1 | 11/2009 | Chin-Cheng | | |
| 2011/0169793 A1 | 7/2011 | Chen et al. | | |
| 2011/0316833 A1 | 12/2011 | Chang et al. | | |
| 2016/0358666 A1 | 12/2016 | Pang | | |
| 2017/0039968 A1* | 2/2017 | Chen | ............ | G09G 3/3648 |
| 2017/0178558 A1* | 6/2017 | Zhou | ............ | G09G 3/20 |
| 2019/0066560 A1* | 2/2019 | Mi | ............ | G09G 3/20 |

FOREIGN PATENT DOCUMENTS

| | | |
|---|---|---|
| CN | 105788555 A | 7/2016 |
| CN | 105869566 A | 8/2016 |
| CN | 106157898 A | 11/2016 |

OTHER PUBLICATIONS

Notice of Transmittal of the International Search Report of PCT/CN2017/106517 in Chinese, dated Jan. 16, 2018.

Written Opinion of the International Searching Authority of PCT/CN2017/106517 in Chinese, dated Jan. 16, 2018 with English translation.

Chinese Office Action in Chinese Application No. 201710218273.7, dated Dec. 2, 2019 with English translation.

* cited by examiner

SHIFT-BUFFER CIRCUIT, GATE DRIVING CIRCUIT, DISPLAY PANEL AND DRIVING METHOD

CROSS REFERENCE TO RELATED APPLICATIONS

This application is the National Stage of PCT/CN2017/106517 filed on Oct. 17, 2017, which claims priority under 35 U.S.C. § 119 of Chinese Application No. 201710218273.7 filed on Apr. 5, 2017, the disclosure of which is incorporated by reference.

TECHNICAL FIELD

Embodiments of the present disclosure relate to a shift-buffer circuit, a gate driving circuit, a display panel, a display device and a driving method.

BACKGROUND

With rapid development of display technology, display panels are developed increasingly toward a trend of high integration and low cost. A Gate-driver on Array (GOA) technology is to integrate a gate driving circuit directly on an array substrate of a display device by a photoetching process, a GOA circuit usually includes a plurality of cascaded shift registers, and each of the shift registers corresponds to a gate line corresponding to a row of pixels (for example, each of the shift registers provides a scan driving signal to a gate line corresponding to a row of pixels), so as to realize scan driving of the display panel. The integrated technology can save space of a bonding region and a fan-out region of the gate Integrated Circuit (IC), thereby achieving a narrow frame of the display panel while reducing a product cost and increasing a product yield.

SUMMARY

Embodiments of the disclosure provide a shift-buffer circuit, comprising: a shift register and a plurality of buffers connected with the shift register, wherein: the shift register includes a shift output terminal; the shift register is configured to output a shift output signal from the shift output terminal, in response to a shift clock signal; each of the buffers includes a buffer input terminal and a buffer output terminal, the buffer input terminal being connected with the shift output terminal; and each of the buffers is configured to output a buffer output signal from the buffer output terminal, in response to a buffer clock signal.

For example, in the shift-buffer circuit provided in embodiments of the disclosure, the shift register includes: a shift input circuit, connected with a shift input terminal and a shift pull-up node respectively; a first shift reset circuit, connected with the shift pull-up node, a first shift pull-down node, and a first power supply terminal respectively; a shift output circuit, connected with the shift pull-up node, a shift clock signal terminal and the shift output terminal respectively; a first shift output pull-down circuit, connected with the shift output terminal, the first shift pull-down node and the first power supply terminal respectively; a first pull-down node control circuit, connected with the first shift pull-down node, a first power signal terminal and the first power supply terminal respectively; and a shift storage capacitor, connected with the shift pull-up node and the shift output terminal respectively.

For example, in the shift-buffer circuit provided in embodiments of the disclosure, each of the buffers includes: a buffer input circuit, connected with the buffer input terminal and a buffer pull-up node respectively; a first buffer reset circuit, connected with the buffer pull-up node, a first buffer pull-down node and a second power supply terminal respectively; a buffer output circuit, connected with the buffer pull-up node, a buffer clock signal terminal and the buffer output terminal respectively; a first buffer output pull-down circuit, connected with the buffer output terminal, the first buffer pull-down node and the second power supply terminal respectively; and a buffer storage capacitor, connected with the buffer pull-up node and the buffer output terminal respectively.

For example, in the shift-buffer circuit provided in embodiments of the disclosure, the second power supply terminal is connected with the first power supply terminal, and the first buffer pull-down node is connected with the first shift pull-down node.

For example, in the shift-buffer circuit provided in embodiments of the disclosure, the shift input circuit includes a first shift transistor, a first electrode of the first shift transistor being connected with the shift input terminal, a gate electrode of the first shift transistor being connected with the shift input terminal, and a second electrode of the first shift transistor being connected with the shift pull-up node; the first shift reset circuit includes a second shift transistor, a first electrode of the second shift transistor being connected with the shift pull-up node, a gate electrode of the second shift transistor being connected with the first shift pull-down node, and a second electrode of the second shift transistor being connected with the first power supply terminal; the shift output circuit includes a third shift transistor, a first electrode of the third shift transistor being connected with the shift clock signal terminal, a gate electrode of the third shift transistor being connected with the shift pull-up node, and a second electrode of the third shift transistor being connected with the shift output terminal; the first shift output pull-down circuit includes a fourth shift transistor, a first electrode of the fourth shift transistor being connected with the shift output terminal, a gate electrode of the fourth shift transistor being connected with the first shift pull-down node, and a second electrode of the fourth shift transistor being connected with the first power supply terminal; the first pull-down node control circuit includes a fifth shift transistor and a sixth shift transistor, a first electrode of the fifth shift transistor being connected with the first power signal terminal, a gate electrode of the fifth transistor being connected with the first power signal terminal, a second electrode of the fifth shift transistor being connected with the first shift pull-down node, a first electrode of the sixth shift transistor being connected with the first shift pull-down node, a gate electrode of the sixth shift transistor being connected with the shift pull-up node, and a second electrode of the sixth shift transistor being connected with the first power supply terminal; and a first terminal of the shift storage capacitor is connected with the shift pull-up node, and a second terminal of the shift storage capacitor is connected with the shift output terminal.

For example, in the shift-buffer circuit provided in embodiments of the disclosure, the buffer input circuit includes a first buffer transistor, a first electrode of the first buffer transistor being connected with the buffer input terminal, a gate electrode of the first buffer transistor being connected with an enabled signal terminal, and a second electrode of the first buffer transistor being connected with the buffer pull-up node; the first buffer reset circuit includes a second buffer transistor, a first electrode of the second buffer transistor being connected with the buffer pull-up node, a gate electrode of the second buffer transistor being connected with the first buffer pull-down node, and a second electrode of the second buffer transistor being connected with the second power supply terminal; the buffer output circuit includes a third buffer transistor, a first electrode of the third buffer transistor being connected with the buffer clock signal terminal, a gate electrode of the third buffer transistor being connected with the buffer pull-up node, and a second electrode of the third buffer transistor being connected with the buffer output terminal; the first buffer output pull-down circuit includes a fourth buffer transistor, a first electrode of the fourth buffer transistor being connected with the buffer output terminal, a gate electrode of the fourth buffer transistor being connected with the first buffer pull-down node, and a second electrode of the fourth buffer transistor being connected with the second power supply terminal; and a first terminal of the buffer storage capacitor is connected with the buffer pull-up node, and a second terminal of the buffer storage capacitor is connected with the buffer output terminal.

For example, in the shift-buffer circuit provided in embodiments of the disclosure, the shift register further includes: a second shift reset circuit, connected with the shift pull-up node, a second shift pull-down node and a first power supply terminal respectively; a second shift output pull-down circuit, connected with the shift output terminal, the second shift pull-down node and the first power supply terminal respectively; and a second pull-down node control circuit, connected with the second shift pull-down node, a second power signal terminal and the first power supply terminal respectively. Each of the buffers further includes: a second buffer reset circuit, connected with the buffer pull-up node, a second buffer pull-down node and the second power supply terminal respectively; and a second buffer output pull-down circuit, connected with the buffer output terminal, the second buffer pull-down node and the second power supply terminal respectively, wherein a first power signal provided by the first power signal terminal and a second power signal provided by the second power signal terminal are mutually reverse signals.

For example, in the shift-buffer circuit provided in embodiments of the disclosure, the second shift reset circuit includes a seventh shift transistor, a first electrode of the seventh shift transistor being connected with the shift pull-up node, a gate electrode of the seventh shift transistor being connected with the second shift pull-down node, and a second electrode of the seventh shift transistor being connected with the first power supply terminal; the second shift output pull-down circuit includes an eighth shift transistor, a first electrode of the eighth shift transistor being connected with the shift output terminal, a gate electrode of the eighth shift transistor being connected with the second shift pull-down node, and a second electrode of the eighth shift transistor being connected with the first power supply terminal; the second pull-down node control circuit includes a ninth shift transistor and a tenth shift transistor, a first electrode of the ninth shift transistor being connected with the second power signal terminal, a gate electrode of the ninth shift transistor being connected with the second power signal terminal, a second electrode of the ninth shift transistor being connected with the second shift pull-down node, a first electrode of the tenth shift transistor being connected with the second shift pull-down node, a gate electrode of the tenth shift transistor being connected with the shift pull-up node, and a second electrode of the tenth shift transistor being connected with the first power supply terminal; the second buffer reset circuit includes a fifth buffer transistor, a first electrode of the fifth buffer transistor being connected with the buffer pull-up node, a gate electrode of the fifth buffer transistor being connected with the second buffer pull-down node, and a second electrode of the fifth buffer transistor being connected with the second power supply terminal; and the second buffer output pull-down circuit includes a sixth buffer transistor, a first electrode of the sixth buffer transistor being connected with the buffer output terminal, a gate electrode of the sixth buffer transistor being connected with the second buffer pull-down node, and a second electrode of the sixth buffer transistor being connected with the second power supply terminal.

For example, in the shift-buffer circuit provided in embodiments of the disclosure, the second buffer pull-down node is connected with the second shift pull-down node.

For example, in the shift-buffer circuit provided in embodiments of the disclosure, each of the shift registers is connected with four of the buffers.

Embodiments of the disclosure further provide a gate driving circuit, comprising shift-buffer circuits in a plurality of stages, wherein a shift-buffer circuit of each stage includes the shift-buffer circuit described above.

For example, in the gate driving circuit provided in embodiments of the disclosure, a shift output terminal of a shift register in a shift-buffer circuit of a (2n−1)-th stage is connected with a shift input terminal of a shift register in a shift-buffer circuit of a (2n+1)-th stage; and a shift output terminal of a shift register in a shift-buffer circuit of a 2n-th stage is connected with a shift input terminal of a shift register in a shift-buffer circuit of a (2n+2)-th stage, where n is an integer greater than zero.

For example, in the gate driving circuit provided in embodiments of the disclosure, an enabled signal terminal of a buffer in the shift-buffer circuit of the (2n−1)-th stage is configured to receive a first enabled signal; and an enabled signal terminal of a buffer in the shift-buffer circuit of the 2n-th stage is configured to receive a second enabled signal.

Embodiments of the disclosure further provide a display panel, comprising the gate driving circuit described above.

Embodiments of the disclosure further provide a display device, comprising the display panel described above.

Embodiments of the disclosure further provide a method of driving the shift-buffer circuit described above, comprising: applying a shift clock signal to a shift register, to make the shift register output a shift output signal in response to the shift clock signal; and applying buffer clock signals to a plurality of buffers in a period of the shift output signal, to make the plurality of buffers output buffer output signals sequentially.

BRIEF DESCRIPTION OF THE DRAWINGS

In order to illustrate the technical solutions in the embodiments of the present disclosure more clearly, the drawings needed to be used in the description of the embodiments will be briefly described in the following; it is obvious that the drawings described below are only related to some embodiments of the present disclosure, and are not intended to be limitative to the disclosure.

DETAILED DESCRIPTION

Figure 1:
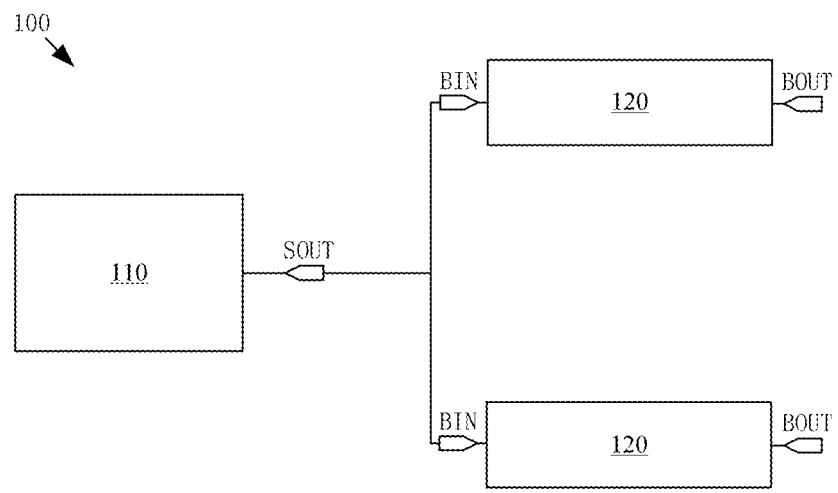
FIG. 1 is a first schematic diagram of a shift-buffer circuit provided by an embodiment of the present disclosure.

Hereinafter, the technical solutions of the embodiments of the present disclosure will be described in a clearly and fully understandable way in conjunction with the drawings related to the embodiments of the present disclosure; with reference to non-restrictive exemplary embodiments shown in the drawings and described in detail in the following description, exemplary embodiments of the present disclosure and their various features and favorable details are illustrated more comprehensively. It should be noted that, the features shown in the drawings are not necessarily drawn according to scale. Known materials, components and process technologies are not described in the present disclosure so as not to obscure the exemplary embodiments of the present disclosure. Examples given are merely intended to facilitate understanding of implementation of exemplary embodiments of the present disclosure, and further enable those skilled in the art to implement the exemplary embodiments. Therefore, the examples should not be construed as limiting the scope of the exemplary embodiments of the present disclosure.

Unless otherwise defined, technical terms or scientific terms used in the present disclosure should be of general meaning as understood by those ordinarily skilled in the art. "First", "second" and similar words used in the present disclosure do not represent any sequence, quantity or importance and merely intend to differentiate different composite parts. In addition, in respective embodiments of the present disclosure, same or similar reference signs denote same or similar parts.

A resolution of a display panel adopting a conventional gate driving circuit is fixed, the resolution cannot be adjusted according to actual needs, and selective driving cannot be implemented in different regions of the display panel. A shift-buffer circuit, a gate driving circuit, a display panel and a driving method provided by embodiments of the present disclosure can change a display resolution and can perform selective driving in different regions of the display panel.

Figure 2:
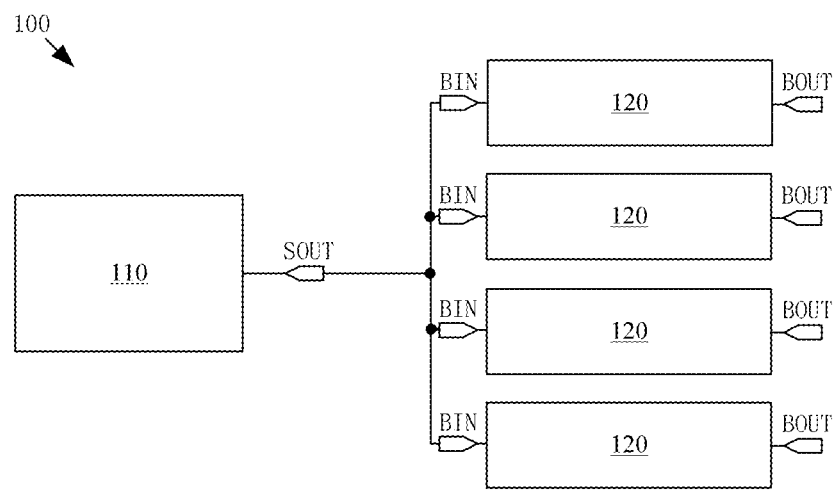
FIG. 2 is a second schematic diagram of a shift-buffer circuit provided by an embodiment of the present disclosure.

An embodiment of the present disclosure provides a shift-buffer circuit 100. As shown in FIG. 1 and FIG. 2, the shift-buffer circuit 100 comprises: a shift register 110 and a plurality of buffers 120 connected with the shift register 110. The shift register 110 includes a shift output terminal SOUT; the shift register 110 is configured to output a shift output signal from the shift output terminal SOUT, in response to a shift clock signal CLKS. Each of the buffers 120 includes a buffer input terminal BIN and a buffer output terminal BOUT, and each buffer input terminal BIN is connected with the shift output terminal SOUT; each of the buffers 120 is configured to output a buffer output signal from the buffer output terminal BOUT, in response to a buffer clock signal CLKB. The buffer output signal is a gate scanning signal. For example, each buffer output signal may be used as a gate scanning signal for driving a row or a column of pixels in a display panel for display.

For example, as shown in FIG. 1, the shift-buffer circuit 100 comprises a shift register 110 and two buffers 120 connected with the shift register 110. For another example, as shown in FIG. 2, the shift-buffer circuit 100 comprises a shift register 110 and four buffers 120 connected with the shift register 110. It should be noted that, in the embodiments of the present disclosure, the number of the buffers 120 connected with a shift register 110 is not limited to two or four, and may also be other numbers.

For example, if the number of the buffers 120 connected with a shift register 110 is larger, times of a resolution ratio of a gate driving circuit or a display panel that is applied with the shift buffer circuit 100 are higher; but current leakage situation of the corresponding shift buffer circuit 100 may also be more serious. When the shift-buffer circuit 100 comprises a shift register 110 and four buffers 120 connected with the shift register 110, the resolution ratio change and the current leakage situation of the shift-buffer circuit 110 are better balanced. Hereinafter, it is described by taking an example that the shift-buffer circuit 100 comprises a shift register 110 and four buffers 120 connected with the shift register 110.

Figure 3:
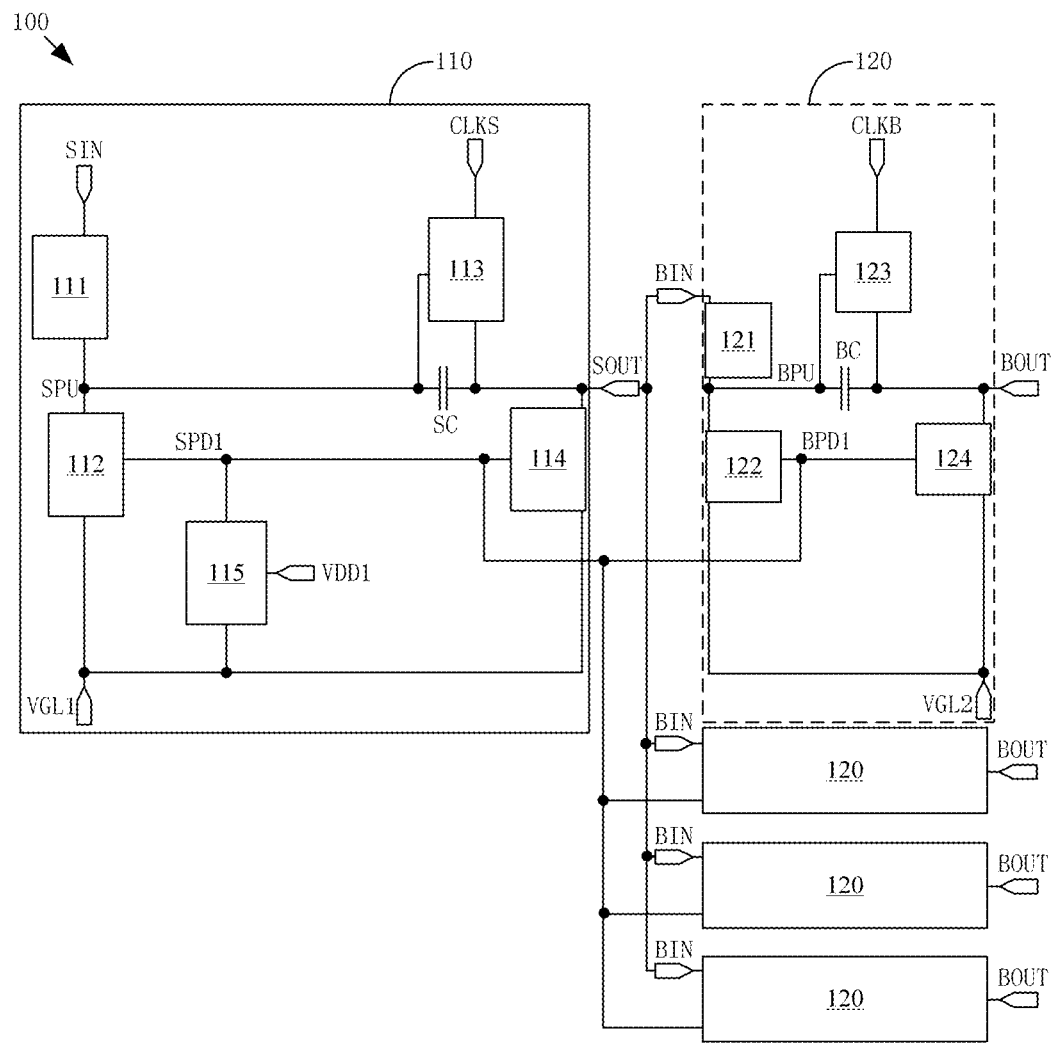
FIG. 3 is a third schematic diagram of a shift-buffer circuit provided by an embodiment of the present disclosure.

For example, as shown in FIG. 3, in a shift-buffer circuit 100 provided by an embodiment of the present disclosure, the shift register 110 comprises a shift input circuit 111, a first shift reset circuit 112, a shift output circuit 113, a first shift output pull-down circuit 114, a first pull-down node control circuit 115, and a shift storage capacitor SC. The shift input circuit 111 is connected with a shift input terminal SIN and a shift pull-up node SPU, respectively; the first shift reset circuit 112 is connected with the shift pull-up node SPU, a first shift pull-down node SPD1, and a first power supply terminal VGL1, respectively; the shift output circuit 113 is connected with the shift pull-up node SPU, a shift clock signal terminal (which is used for providing a shift clock signal CLKS) and the shift output terminal SOUT, respectively; the first shift output pull-down circuit 114 is connected with the shift output terminal SOUT, the first pull-down node SPD1 and the first power supply terminal VGL1, respectively; the first pull-down node control circuit 115 is connected with the first shift pull-down node SPD1, a first power signal terminal VDD1 and the first power supply terminal VGL1, respectively; and the shift storage capacitor SC is connected with the shift pull-up node SPU and the shift output terminal SOUT, respectively.

For example, as shown in FIG. 3, in the shift-buffer circuit 100 provided by an embodiment of the present disclosure, each buffer 120 includes: a buffer input circuit 121, a first buffer reset circuit 122, a buffer output circuit 123, a first buffer output pull-down circuit 124 and a buffer storage capacitor BC. The buffer input circuit 121 is connected with the buffer input terminal BIN and a buffer pull-up node BPU, respectively; the first buffer reset circuit 122 is connected with the buffer pull-up node BPU, a first buffer pull-down node BPD1 and a second power supply terminal VGL2, respectively; the buffer output circuit 123 is connected with the buffer pull-up node BPU, a buffer clock signal terminal (which is used for providing a buffer clock signal CLKB) and the buffer output terminal BOUT, respectively; the first buffer output pull-down circuit 124 is connected with the buffer output terminal BOUT, the first buffer pull-down node BPD1 and a second power supply terminal VGL2, respectively; and the buffer storage capacitor BC is connected with the buffer pull-up node BPU and the buffer output terminal BOUT, respectively.

It should be noted that, in the embodiments of the present disclosure, the shift register 110 and the buffer 120 may further include other additional circuits, the shift register 110 in FIG. 3 may be combined with other buffers to form a shift buffer circuit, and the buffer 120 in FIG. 3 may also be combined with other shift registers to form a shift buffer circuit.

For example, in the shift-buffer circuit 100 provided by an embodiment of the present disclosure, the first buffer pull-down node BPD1 is connected with the first shift pull-down node SPD1. That is, the shift register 110 and the buffer 120 may share the first pull-down node, so that the number of circuits for controlling a voltage of the first pull-down node may be reduced, thereby simplifying the circuit and facilitating design and production of the circuit. For example, the first pull-down node which is shared includes the first buffer pull-down node BPD1 and the first shift pull-down node SPD1 which are electrically connected with each other, and thus the voltages of the first buffer pull-down node BPD1 and the first shift pull-down node SPD1 may be controlled by a same circuit.

Figure 4:
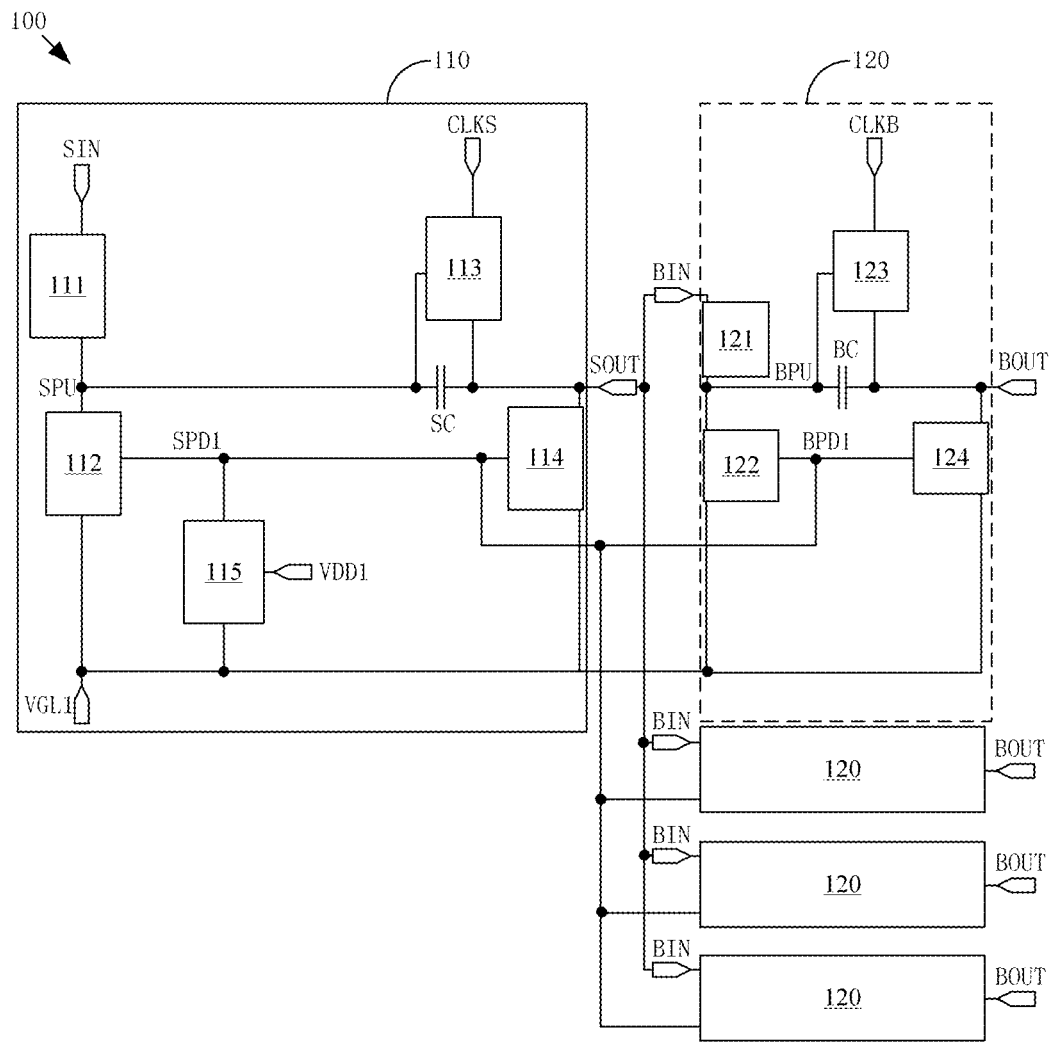
FIG. 4 is a fourth schematic diagram of a shift-buffer circuit provided by an embodiment of the present disclosure.
Figure 5:
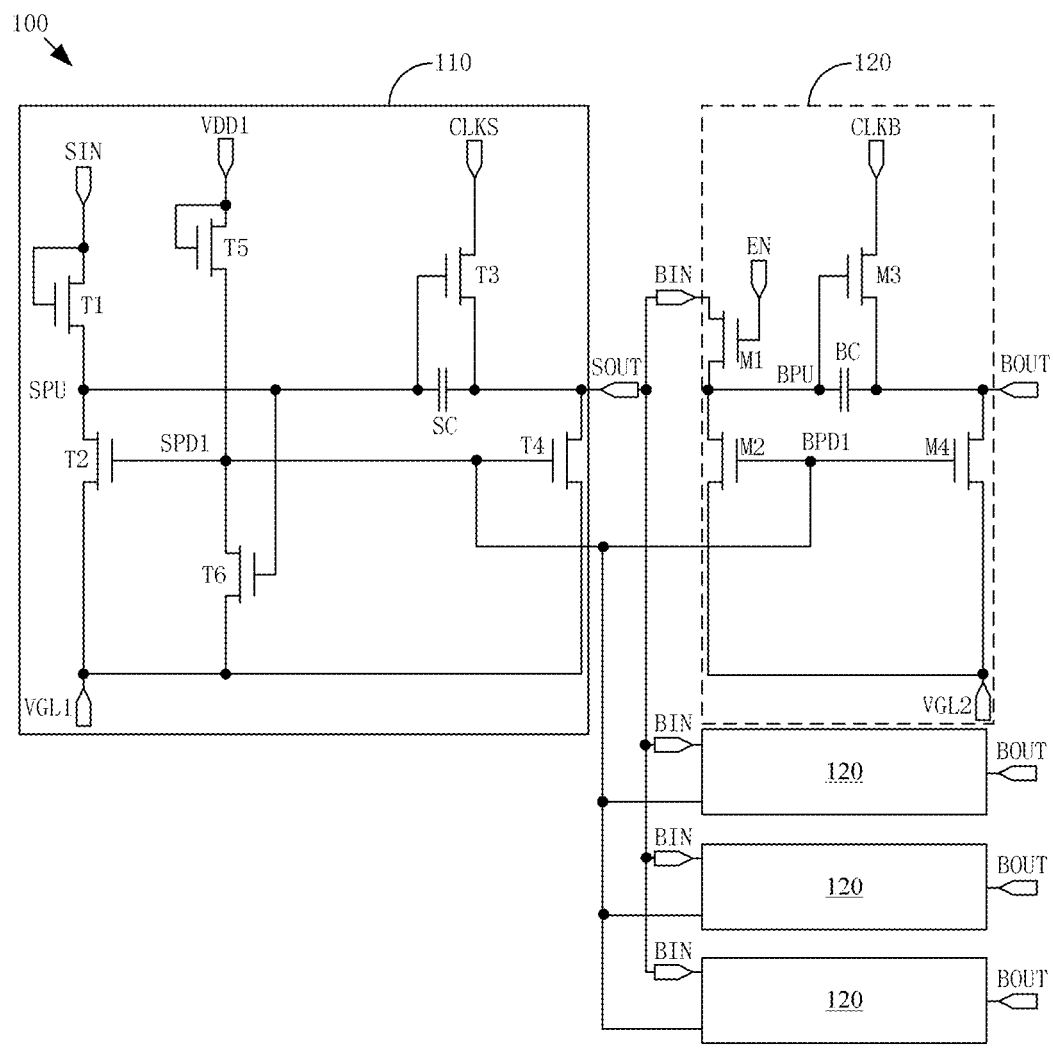
FIG. 5 is a fifth schematic diagram of a shift-buffer circuit provided by an embodiment of the present disclosure.

For example, in the shift-buffer circuit 100 provided by an embodiment of the present disclosure, a second power supply terminal VGL2 shown in FIG. 5 may be connected with the first power supply terminal VGL1 (a circuit after being connected is shown in FIG. 4). For example, the second power supply terminal VGL2 is connected with the first power supply terminal VGL1, which may simplify the circuit and facilitate design and production of the circuit. For example, a voltage of the first power supply terminal VGL1 is a low level voltage (for example, 0V, −1V or other values), and a voltage of the second power terminal VGL2 is also a low level voltage.

For example, as shown in FIG. 5, in a shift-buffer circuit 100 provided by an embodiment of the present disclosure, the shift input circuit 111 includes a first shift transistor T1. A first electrode of the first shift transistor T1 is connected with the shift input terminal SIN, a gate electrode of the first shift transistor T1 is connected with the shift input terminal SIN, and a second electrode of the first shift transistor T1 is connected with the shift pull-up node SPU. The first shift reset circuit 112 includes a second shift transistor T2. A first electrode of the second shift transistor T2 is connected with the shift pull-up node SPU, a gate electrode of the second shift transistor T2 is connected with the first shift pull-down node SPD1, and a second electrode of the second shift transistor T2 is connected with the first power supply terminal VGL1. The shift output circuit 113 includes a third shift transistor T3. A first electrode of the third shift transistor T3 is connected with the shift clock signal terminal for receiving a shift clock signal CLKS, a gate electrode of the third shift transistor T3 is connected with the shift pull-up node SPU, a second electrode of the third shift transistor T3 is connected with the shift output terminal SOUT. The first shift output pull-down circuit 114 includes a fourth shift transistor T4. A first electrode of the fourth shift transistor is connected with the shift output terminal SOUT, a gate electrode of the fourth shift transistor is connected with the first shift pull-down node SPD1, and a second electrode of the fourth shift transistor is connected with the first power supply terminal VGL1. The first pull-down node control circuit 115 includes a fifth shift transistor T5 and a sixth shift transistor T6. A first electrode of the fifth shift transistor T5 is connected with the first power signal terminal VDD1, a gate electrode of the fifth transistor T5 is connected with the first power signal terminal VDD1, a second electrode of the fifth shift transistor T5 is connected with the first shift pull-down node SPD1. A first electrode of the sixth shift transistor T6 is connected with the first shift pull-down node SPD1, a gate electrode of the sixth shift transistor T6 is connected with the shift pull-up node SPU, and a second electrode of the sixth shift transistor T6 is connected with the first power supply terminal VGL1. A first terminal of the shift storage capacitor SC is connected with the shift pull-up node SPU, and a second terminal of the shift storage capacitor SC is connected with the shift output terminal SOUT.

For example, as shown in FIG. 5, in the shift-buffer circuit 100 provided by an embodiment of the present disclosure, the buffer input circuit 121 includes a first buffer transistor M1. A first electrode of the first buffer transistor M is connected with the buffer input terminal BIN, a gate electrode of the first buffer transistor M1 is connected with an enabled signal terminal EN, and a second electrode of the first buffer transistor M1 is connected with the buffer pull-up node BPU. The first buffer reset circuit 122 includes a second buffer transistor M2. A first electrode of the second buffer transistor M2 is connected with the buffer pull-up node BPU, a gate electrode of the second buffer transistor M2 is connected with the first buffer pull-down node BPD1, and a second electrode of the second buffer transistor M2 is connected with the second power supply terminal VGL2. The buffer output circuit 123 includes a third buffer transistor M3. A first electrode of the third buffer transistor M3 is connected with the buffer clock signal terminal to receive a buffer clock signal CLKB, a gate electrode of the third buffer transistor M3 is connected with the buffer pull-up node BPU, and a second electrode of the third buffer transistor M3 is connected with the buffer output terminal BOUT. The first buffer output pull-down circuit 124 includes a fourth buffer transistor M4. A first electrode of the fourth buffer transistor M4 is connected with the buffer output terminal BOUT, a gate electrode of the fourth buffer transistor M4 is connected with the first buffer pull-down node BPD1, and a second electrode of the fourth buffer transistor M4 is connected with the second power supply terminal VGL2. A first terminal of the buffer storage capacitor BC is connected with the buffer pull-up node BPU, and a second terminal of the buffer storage capacitor BC is connected with the buffer output terminal BOUT.

Figure 6:
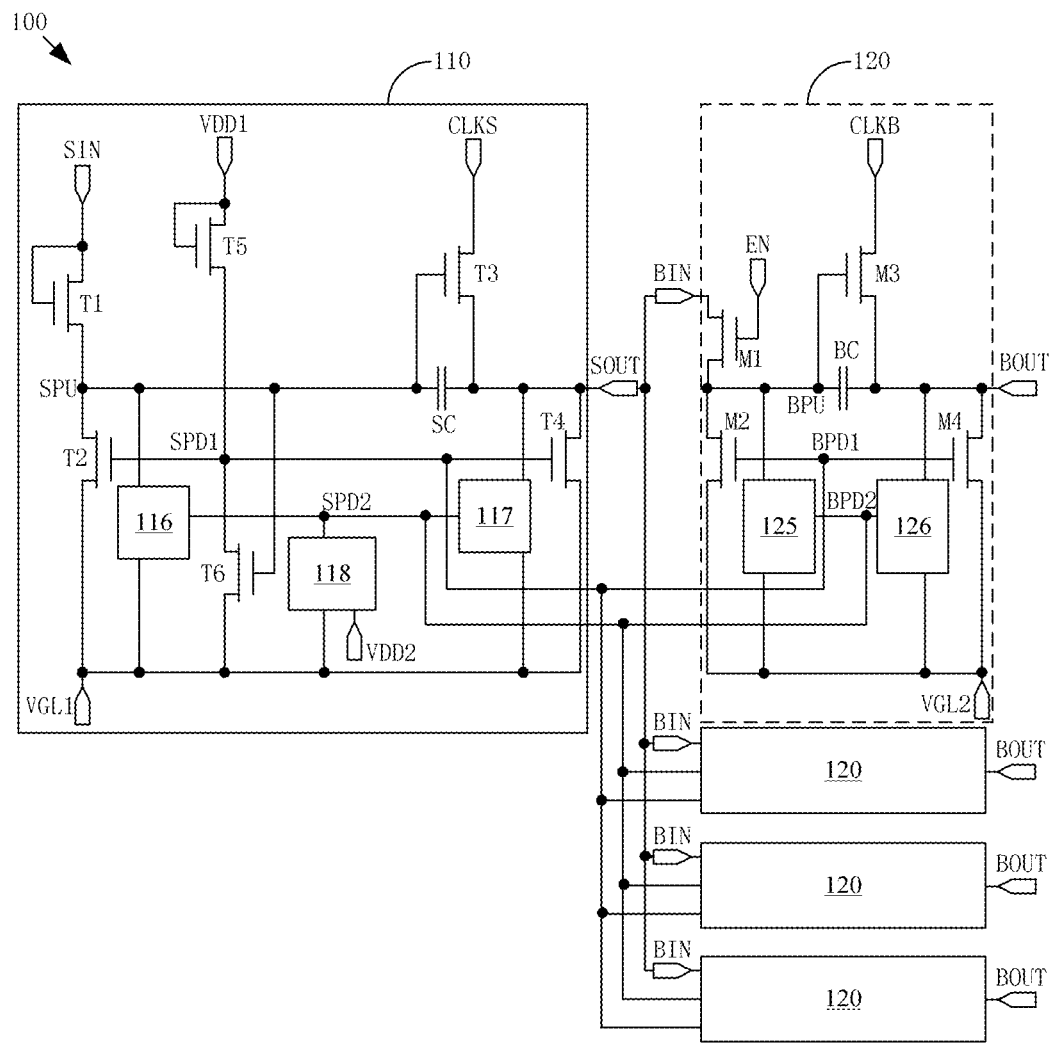
FIG. 6 is a sixth schematic diagram of a shift-buffer circuit provided by an embodiment of the present disclosure.

For example, as shown in FIG. 6, in a shift-buffer circuit 100 provided by an embodiment of the present disclosure, the shift register 110 further includes: a second shift reset circuit 116, a second shift output pull-down circuit 117 and a second pull-down node control circuit 118. The second shift reset circuit 116 is connected with the shift pull-up node SPU, a second shift pull-down node SPD2 and a first power supply terminal VGL1, respectively; the second shift output pull-down circuit 117 is connected with the shift output terminal SOUT, the second shift pull-down node SPD2 and the first power supply terminal VGL1, respectively; and the second pull-down node control circuit 118 is connected with the second shift pull-down node SPD2, a second power signal terminal VDD2 and the first power supply terminal VGL1, respectively.

For example, as shown in FIG. 6, each of the buffers 120 further includes a second buffer reset circuit 125 and a second buffer output pull-down circuit 126. The second buffer reset circuit 125 is connected with the buffer pull-up node BPU, a second buffer pull-down node BPD2 and the second power supply terminal VGL2, respectively; and the second buffer output pull-down circuit 126 is connected with the buffer output terminal BOUT, the second buffer pull-down node BPD2 and the second power supply terminal VGL2, respectively.

For example, a first power signal provided by the first power signal terminal VDD1 and a second power signal provided by the second power signal terminal VDD2 are mutually reverse signals. That is, when the first power signal provided by the first power signal terminal VDD1 is at a high level (e.g., 5V or 8V or other values), the second power signal provided by the second power signal terminal VDD2 is at a low level (e.g., 0V, −1V or other values); when the first power signal provided by the first power signal terminal VDD1 is at a low level (e.g., 0V, −1V, or other values), the second power signal provided by the second power signal terminal VDD2 is at a high level (e.g., 5V or 8V or other values).

Figure 7:
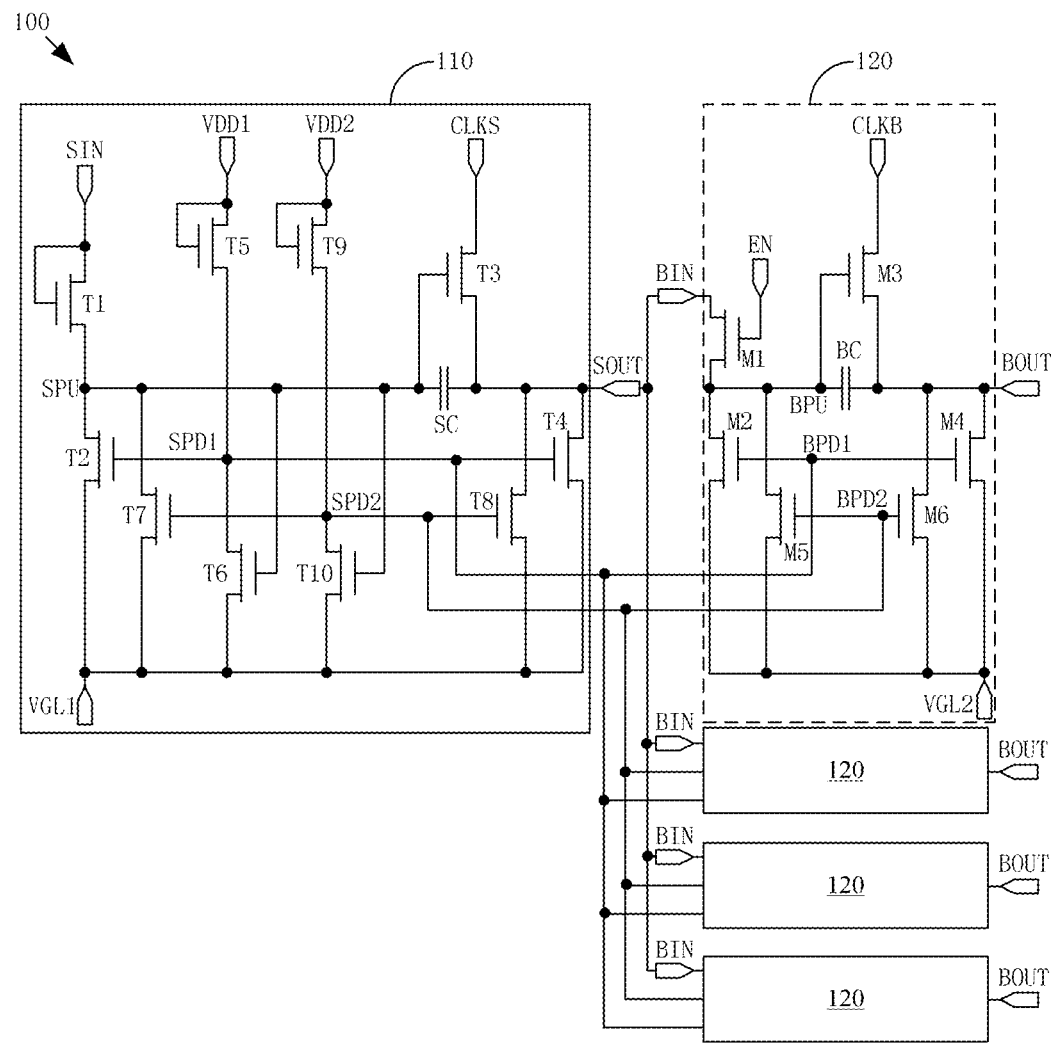
FIG. 7 is a seventh schematic diagram of a shift-buffer circuit provided by an embodiment of the present disclosure.

For example, as shown in FIG. 7, in a shift-buffer circuit 100 provided by an embodiment of the present disclosure, the second shift reset circuit 116 includes a seventh shift transistor T7. A first electrode of the seventh shift transistor T7 is connected with the shift pull-up node SPU, a gate electrode of the seventh shift transistor T7 is connected with the second shift pull-down node SPD2, and a second electrode of the seventh shift transistor T7 is connected with the first power supply terminal VGL1. The second shift output pull-down circuit 117 includes an eighth shift transistor T8. A first electrode of the eighth shift transistor T8 is connected with the shift output terminal SOUT, a gate electrode of the eighth shift transistor T8 is connected with the second shift pull-down node SPD2, and a second electrode of the eighth shift transistor T8 is connected with the first power supply terminal VGL1. The second pull-down node control circuit 118 includes a ninth shift transistor T9 and a tenth shift transistor T10. A first electrode of the ninth shift transistor T9 is connected with the second power signal terminal VDD2, a gate electrode of the ninth shift transistor T9 is connected with the second power signal terminal VDD2, a second electrode of the ninth shift transistor T9 is connected with the second shift pull-down node SPD2. A first electrode of the tenth shift transistor T10 is connected with the second shift pull-down node SPD2, a gate electrode of the tenth shift transistor T10 is connected with the shift pull-up node SPU, and a second electrode of the tenth shift transistor T10 is connected with the first power supply terminal VGL1.

For example, as shown in FIG. 7, the second buffer reset circuit 125 includes a fifth buffer transistor M5. A first electrode of the fifth buffer transistor M5 is connected with the buffer pull-up node BPU, a gate electrode of the fifth buffer transistor M5 is connected with the second buffer pull-down node BPD2, and a second electrode of the fifth buffer transistor M5 is connected with the second power supply terminal VGL2. The second buffer output pull-down circuit 126 includes a sixth buffer transistor M6. A first electrode of the sixth buffer transistor M6 is connected with the buffer output terminal BOUT, a gate electrode of the sixth buffer transistor M6 is connected with the second buffer pull-down node BPD2, and a second electrode of the sixth buffer transistor M6 is connected with the second power supply terminal VGL2.

It should be noted that, the transistors used in the embodiments of the present disclosure may be all thin film transistors, field effect transistors, or other switching devices having same characteristics. Source and drain electrodes of a transistor used herein may be symmetrical in structure, so that the source and drain electrodes may have no difference in structure. In the embodiments of the present disclosure, in order to distinguish the two electrodes of the transistor besides the gate electrode, one of the two electrodes is directly described as a first electrode, and another of the two electrodes is a second electrode, and thus the first electrodes and the second electrodes of all or part of the transistors in the embodiments of the present disclosure are interchangeable as needed. For example, a first electrode of a transistor according to an embodiment of the present disclosure may be a source electrode and a second electrode of the transistor may be a drain electrode; alternatively, the first electrode of the transistor is a drain electrode and the second electrode is a source electrode. In addition, the transistors may be classified into N-type and P-type transistors according to their characteristics. When a transistor is a P-type transistor, a turn-on voltage is a low level voltage (e.g., 0V, −5V or other values) and a turn-off voltage is a high level voltage (e.g., 5V, 10V or other values); when a transistor is an N-type transistor, the turn-on voltage is a high level voltage (e.g., 5V, 10V, or other values) and the turn-off voltage is a low level voltage (e.g., 0V, −5V, or other values). In the embodiments of the present disclosure, it is described by taking an example that the first shift transistor T1, the second shift transistor T2, the third shift transistor T3, the fourth shift transistor T4, the fifth shift transistor T5, the sixth shift transistor T6, the seventh shift transistor T7, the eighth shift transistor T8, the ninth shift transistor T9, the tenth shift transistor T10, the first buffer transistor M1, the second buffer transistor M2, the third buffer transistor M3, the fourth buffer transistor M4, The fifth buffer transistor M5 and the sixth buffer transistor M6 are all N-type transistors. Based on the description and teaching of this implementation in the present disclosure, those skilled in the art can easily conceive implementation modes of using P-type transistors or a combination of the N-type and P-type transistors in the embodiments of the present disclosure without any creative work, and therefore, these implementation modes are also within the scope of the present disclosure.

For example, as shown in FIG. 7, in the shift-buffer circuit 100 provided by an embodiment of the present disclosure, the second buffer pull-down node BPD2 may be connected with the second shift pull-down node SPD2. That is, the shift register 110 and the buffer 120 may share the second pull-down node, so that the number of circuits for controlling voltages of the second pull-down nodes BPD2 and SPD2 may be reduced, thereby simplifying the circuit and facilitating design and production of the circuit. For example, the shared second pull-down node may include the second buffer pull-down node BPD2 and the second shift pull-down node SPD2 which are electrically connected with each other, so that the voltages of the second buffer pull-down node BPD2 and the second shift pull-down node SPD2 may be controlled by a same circuit.

For example, in the shift-buffer circuit 100 provided by an embodiment of the present disclosure, in different frames, the first pull-down node control circuit 115 and the second pull-down node control circuit 118 may control the first pull-down node (including the first shift pull-down node SPD1 and the first buffer pull-down node BPD1) and the second pull-down node (including the second shift pull-down node SPD2 and the second buffer pull-down node BPD2) to work respectively, so as to reduce a possibility of failure caused by the transistors being turned on for a long time, improve anti-interference ability of the shift-buffer circuit, and improve reliability of the shift-buffer circuit.

For example, "one frame" and "another frame" described in the embodiments of the present disclosure may be two frames adjacent to each other, or two frames not adjacent to each other, which is not limited here. For example, a driving time sequence of respective signals of the shift register may be an alternation of a driving time sequence of the "one frame" and a driving time sequence of the "another frame", and the alternative periods may be alternated every one frame, alternated every two frames, alternated every three frames, etc., which is not limited in the present disclosure.

For example, during a display time of each frame, the first power signal provided by the first power signal terminal VDD1 and the second power signal provided by the second power signal terminal VDD2 are both set to be reverse signals of corresponding signals in a display time of a previous frame. In other words, the first power supply signal provided by the first power signal terminal VDD1 and the second power signal provided by the second power signal terminal VDD2 are both reverse signals of the corresponding signals of the previous frame.

For example, the first power signal provided by the first power signal terminal VDD1 and the second power signal provided by the second power signal terminal VDD2 may be selectively exchanged once every several frames according to specific conditions of the circuit.

For example, in the shift-buffer circuit 100 provided by an embodiment of the present disclosure, each shift register 110 is connected with four buffers 120. It should be noted that, the shift-buffer circuit 100 shown in FIG. 3 to FIG. 7 includes four buffers 120; however, for the sake of clear illustration, only specific components of one buffer 120 are shown, and the other buffers 120 shown as boxes may also have a same or similar circuit structure.

Figure 8:
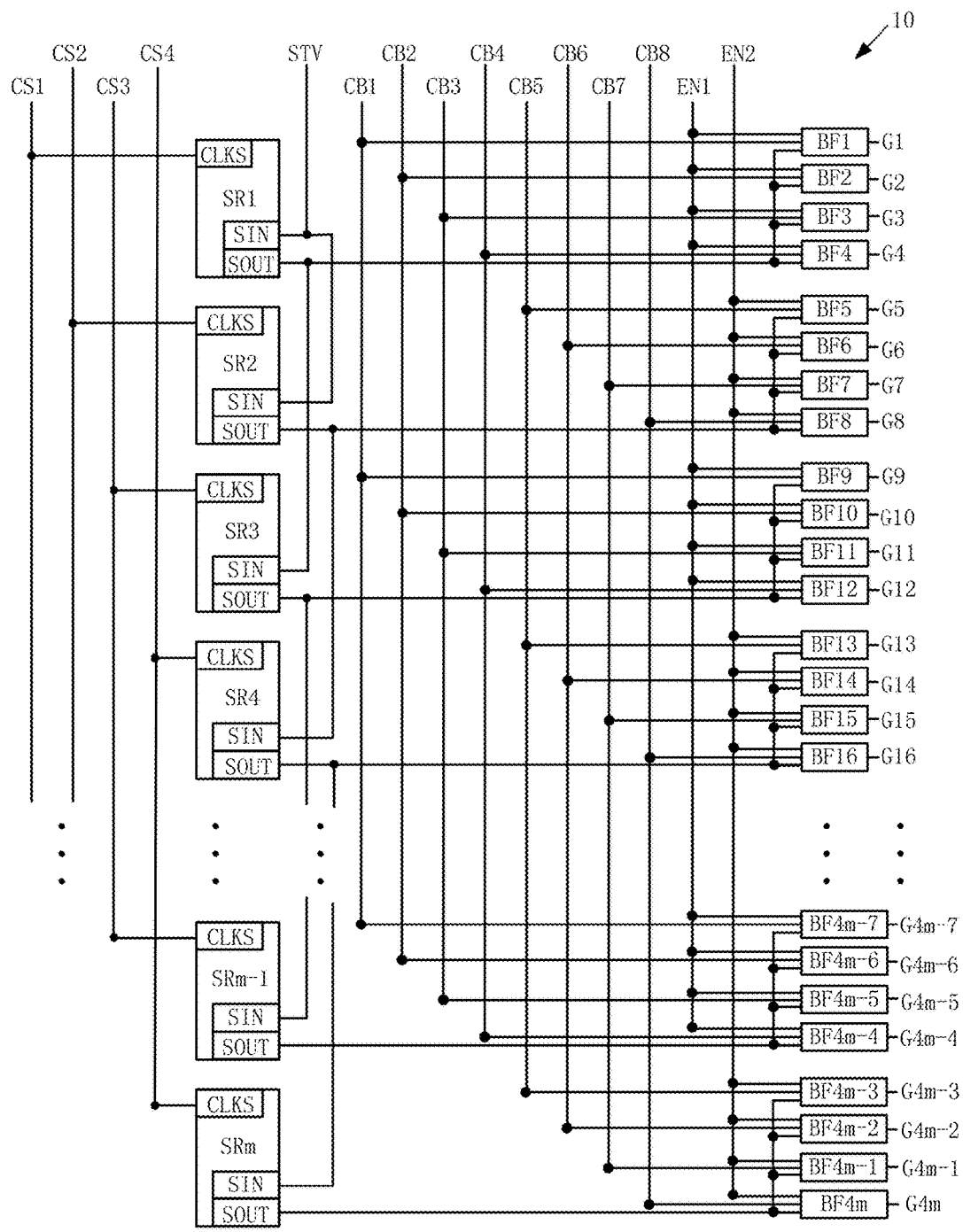
FIG. 8 is a schematic diagram of a gate driving circuit provided by an embodiment of the present disclosure.

An embodiment of the present disclosure further provides a gate driving circuit 10, and as shown in FIG. 8, the gate driving circuit 10 includes multiple stages of shift-buffer circuits 100 provided in any one embodiment of the present disclosure.

For example, a shift clock signal terminal of a shift register of a first stage SR1 is connected with a first shift clock CS1, and a signal provided by the first shift clock CS1 is used as a shift clock signal CLKS; a shift clock signal terminal of a shift register of a second stage SR2 is connected with a second shift clock CS2, and a signal provided by the second shift clock CS2 is used as a shift clock signal CLKS; a shift clock signal terminal of a shift register of a third stage SR3 is connected with a third shift clock CS3, and a signal provided by the third shift clock CS3 is used as a shift clock signal CLKS; a shift clock signal terminal of a shift register of a fourth stage SR4 is connected with a fourth shift clock CS4, and a signal provided by the fourth shift clock CS4 is used as a shift clock signal CLKS. Similarly, a shift clock signal terminal of a shift register of a fifth stage SR5 is connected with the first shift clock CS1, and the signal provided by the first shift clock CS1 is used as a shift clock signal CLKS; a shift clock signal terminal of a shift register of a sixth stage SR6 is connected with the second shift clock CS2, and the signal provided by the second shift clock CS2 is used as a shift clock signal CLKS; a shift clock signal terminal of a shift register of a seventh stage SR7 is connected with the third shift clock CS3, and the signal provided by the third shift clock CS3 is used as a shift clock signal CLKS; and a shift clock signal terminal of a shift register of an eighth stage SR8 is connected with the fourth shift clock CS4, and the signal provided by the fourth shift clock CS4 is used as a shift clock signal CLKS. That is, the shift registers of every four stages form one period, and are connected with the first shift clock CS1, the second shift clock CS2, the third shift clock CS3 and the fourth shift clock CS4, respectively.

For example, a buffer clock signal terminal of a buffer of a first stage BF1 is connected with a first buffer clock CB1, a signal provided by the first buffer clock CB1 is used as a buffer clock signal CLKB; a buffer clock signal terminal of a buffer of a second stage BF2 is connected with a second buffer clock CB2, a signal provided by the second buffer clock CB2 is used as a buffer clock signal CLKB; a buffer clock signal terminal of a buffer of a third stage BF3 is connected with a third buffer clock CB3, a signal provided by the third buffer clock CB3 is used as a buffer clock signal CLKB; a buffer clock signal terminal of a buffer of a fourth stage BF4 is connected with a fourth buffer clock CB4, a signal provided by the fourth buffer clock CB4 is used as a buffer clock signal CLKB; a buffer clock signal terminal of a buffer of a fifth stage BF5 is connected with a fifth buffer clock CB5, a signal provided by the fifth buffer clock CB5 is used as a buffer clock signal CLKB; a buffer clock signal terminal of a buffer of a sixth stage BF6 is connected with a sixth buffer clock CB6, a signal provided by the sixth buffer clock CB6 is used as a buffer clock signal CLKB; a buffer clock signal terminal of a buffer of a seventh stage BF7 is connected with a seventh buffer clock CB7, a signal provided by the seventh buffer clock CB7 is used as a buffer clock signal CLKB; and, a buffer clock signal terminal of a buffer of an eighth stage BF8 is connected with an eighth buffer clock CB8, a signal provided by the eighth buffer clock CB8 is used as a buffer clock signal CLKB. Similarly, the buffers of every eight stages form one period, and are connected with the first buffer clock CB1, the second buffer clock CB2, the third buffer clock CB3, the fourth buffer clock CB4, the fifth buffer clock CB5, the sixth buffer clock CB6, the seventh buffer clock CB7 and the eighth buffer clock CB8, respectively.

For example, as shown in FIG. 8, in the gate driving circuit 10 provided by an embodiment of the present disclosure, a shift output terminal SOUT of a shift register 110 in a shift-buffer circuit 100 of a (2n−1)-th stage is connected with a shift input terminal SIN of a shift register 110 in a shift-buffer circuit 100 of a (2n+1)-th stage, a shift output terminal SOUT of a shift register 110 in a shift-buffer circuit 100 of a 2n-th stage is connected with a shift input terminal SIN of a shift register 110 in a shift-buffer circuit 100 of a (2n+2)-th stage, where n is an integer greater than zero.

For example, as shown in FIG. 8, a shift input terminal SIN of a shift register of a first stage is connected with a first trigger signal terminal for receiving a first trigger signal STY. For example, a shift input terminal SIN of a shift register of a second stage may also be connected with the first trigger signal terminal for receiving the first trigger signal STY. For another example, the shift input terminal SIN of the shift register of the first stage and the shift input terminal SIN of the shift register of the second stage may also receive different trigger signals.

For example, as shown in FIG. 8, the gate driving circuit 10 includes shift registers of m stages SR1, SR2 . . . SRm and buffers of 4m stages BF1, BF2, . . . BF4m correspondingly connected with the shift registers (that is, the gate driving circuit 10 includes m sets of sub-circuits, each set of the sub-circuits includes a shift register and four buffers). The shift registers SR1, SR2 . . . SRm may be a shift register 110 provided by any one embodiment of the present disclosure. The buffers BF1, BF2 . . . BF4m may be a buffer 120 provided by any one embodiment of the present disclosure. Buffer outputs BOUT of the buffers BF1, BF2 . . . BF4m are respectively connected with gate lines G1, G2 . . . G4m, where m is a positive integer, representing a total number of shift registers SR1, SR2 . . . SRm.

For example, as shown in FIG. 8, in the gate driving circuit 10 provided by an embodiment of the present disclosure, an enabled signal terminal EN of the buffer 120 in a shift-buffer circuit 100 of a (2n−1)-th stage is configured to receive a first enabled signal EN1; an enabled signal terminal EN of the buffer 120 in a shift-buffer circuit 100 of a 2n-th stage is configured to receive a second enabled signal EN2. For example, n is a positive integer greater than or equal to 1, n≤m/2−1.

For example, the buffer 120 in the shift-buffer circuit 100 of the (2n−1)-th stage receives the first enabled signal EN1; the buffer 120 in the shift-buffer circuit 100 of the 2n-th stage receives the second enabled signal EN2. The first enabled signal EN1 and the second enabled signal EN2 are different, so as to prevent abnormal output.

Figure 9:
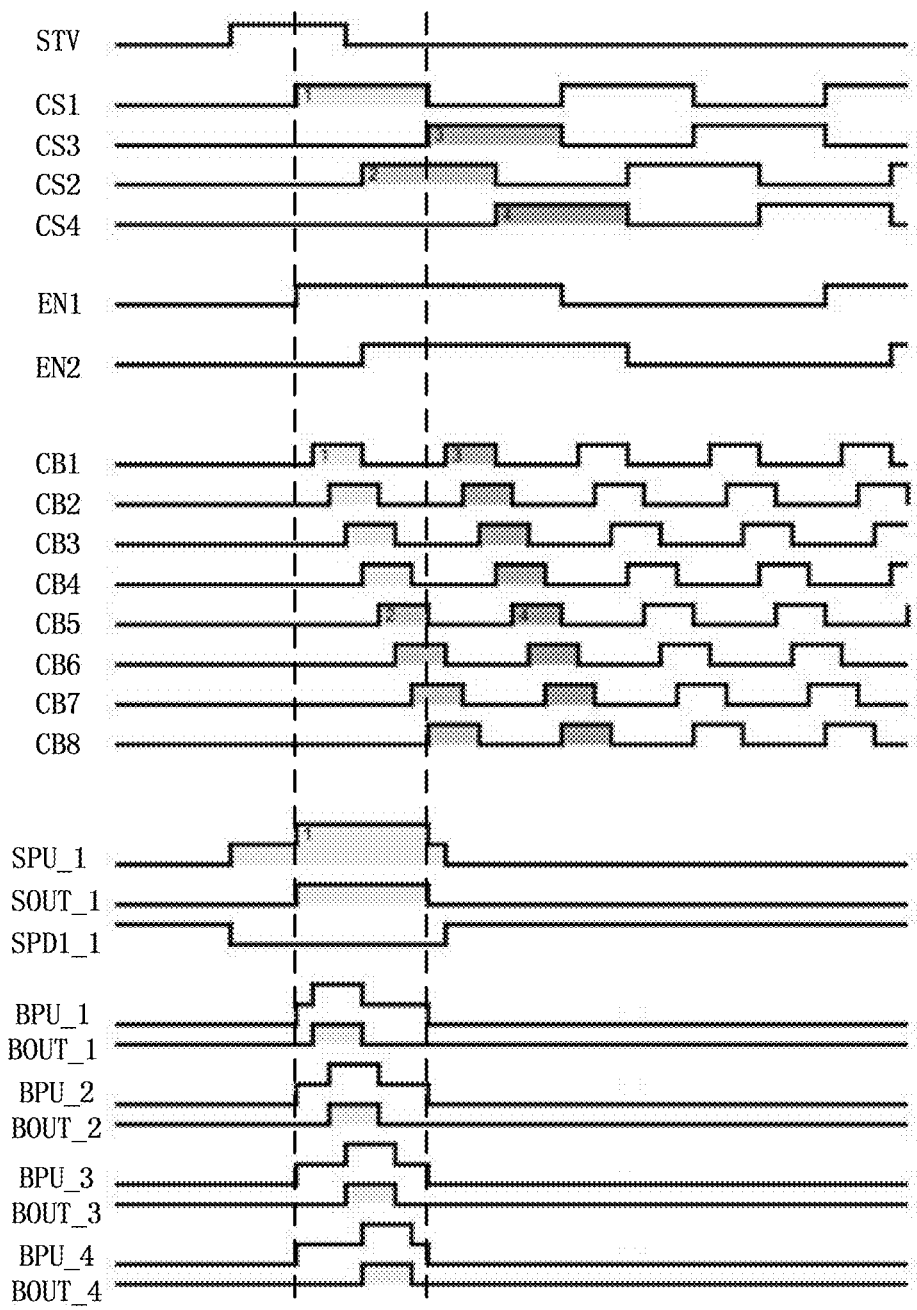
FIG. 9 is a driving time sequence diagram of a gate driving circuit in a first resolution mode provided by an embodiment of the present disclosure.
Figure 10:
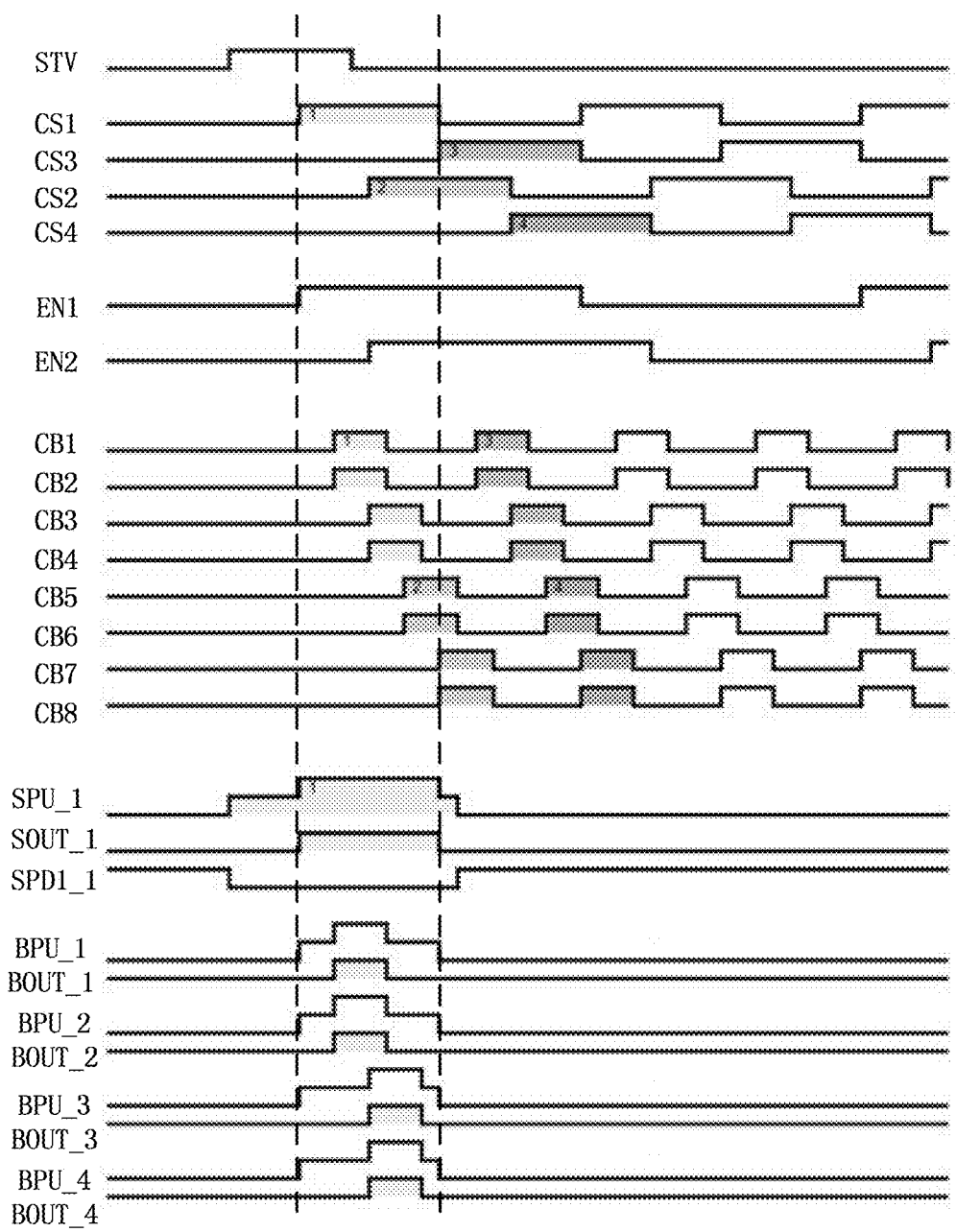
FIG. 10 is a driving time sequence diagram of a gate driving circuit in a second resolution mode provided by an embodiment of the present disclosure.
Figure 11:
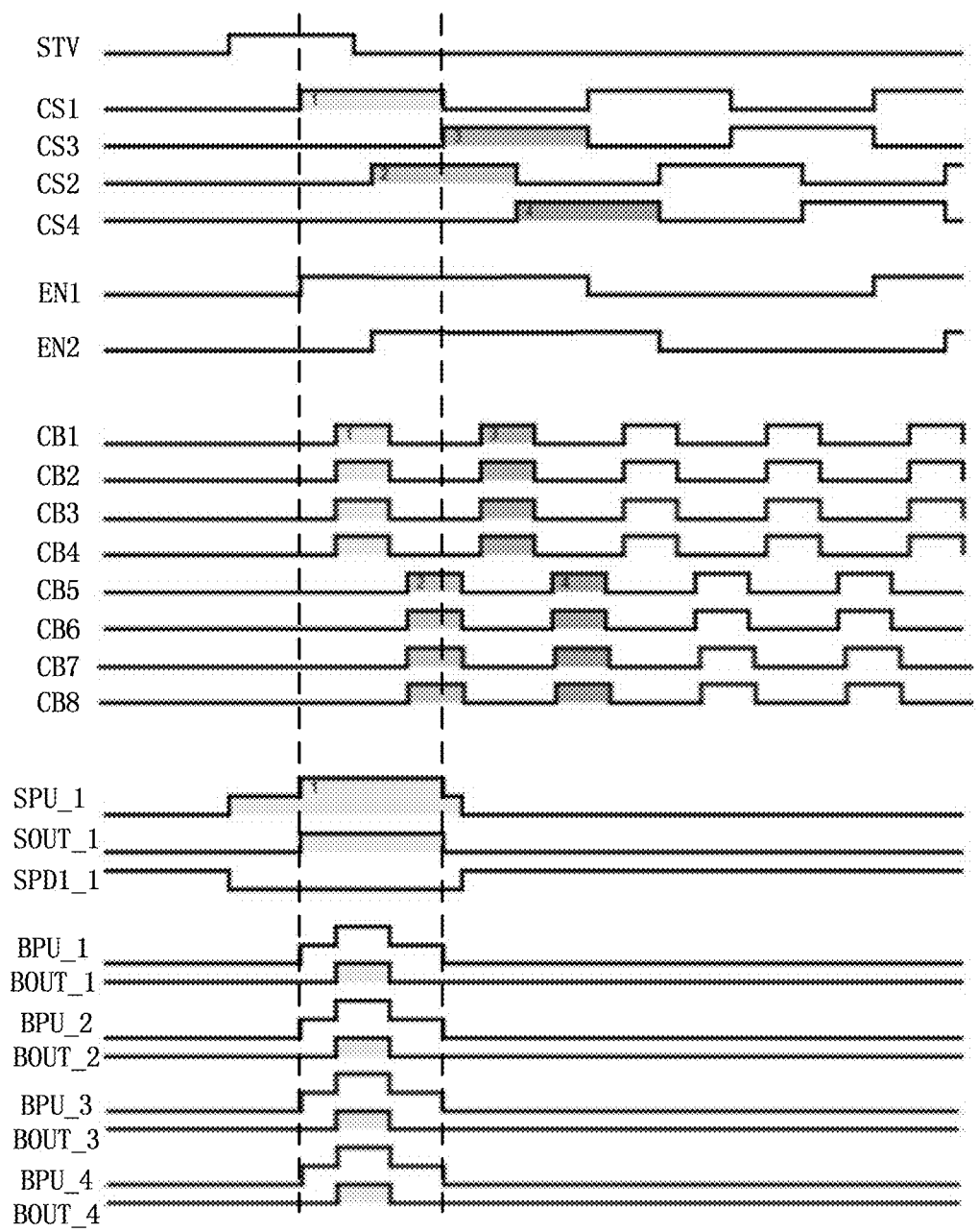
FIG. 11 is a driving time sequence diagram of a gate driving circuit in a third resolution mode provided by an embodiment of the present disclosure.

For example, FIG. 9 is a driving time sequence diagram of a gate driving circuit in a first resolution mode provided by an embodiment of the present disclosure; FIG. 10 is a driving time sequence diagram of the gate driving circuit in a second resolution mode provided by an embodiment of the present disclosure; FIG. 11 is a driving time sequence diagram of the gate driving circuit in a third resolution mode provided by an embodiment of the present disclosure. For example, a resolution of the first resolution mode is 8K, a resolution of the second resolution mode is UD (4K), and a resolution of the third resolution mode is FDH (2K). That is to say, the resolution of the first resolution mode is twice of the resolution of the second resolution mode, and the resolution of the second resolution mode is twice of the resolution of the third resolution mode. The shift-buffer circuit and the gate driving circuit provided by the embodiments of the present disclosure may achieve four times of the resolution change in different regions.

Hereinafter, working principles of the shift register and the gate driving circuit are exemplarily described in conjunction with the shift-buffer circuit shown in FIG. 7, the gate driving circuit shown in FIG. 8 and the driving time sequences shown in FIGS. 9 to 11. For example, since a first power signal provided by the first power signal terminal VDD1 and a second power signal provided by the second power signal terminal VDD2 are mutual reverse signals, in the following it is described by taking an example that the first power signal provided by the first power signal terminal VDD1 is a high level signal and the second power signal provided by the second power signal terminal VDD2 is a low level signal. That is, both the second shift pull-down node SPD2 and the second buffer pull-down node BPD2 are kept at a low level.

For example, referring to FIG. 7, FIG. 8 and FIG. 9, a first trigger signal STV with a high level is input to a first electrode and a gate electrode of the first shift transistor T1, and the first shift transistor T1 inputs the first trigger signal STV with the high level to a shift pull-up node SPU_1, the third shift transistor T3 is turned on, the sixth shift transistor T6 is turned on, a low level voltage of the first power supply terminal VGL1 is input to the first shift pull-down node SPD1, the second shift transistor T2 and the fourth shift transistor T4 are turned off, and since the second shift pull-down node SPD2 is at a low level, the seventh shift transistor T7 and the eighth shift transistor T8 are turned off; a shift clock signal CLKS with a high level is input to a shift output terminal SOUT_1 through the third shift transistor T3; due to a bootstrap effect of a shift storage capacitor SC, a voltage of the shift pull-up node SPU_1 is further increased, so that the third shift transistor T3 is more sufficiently turned on, the shift clock signal CLKS with a high level is output to the shift output terminal SOUT_1 through the third shift transistor T3. The shift output terminal SOUT_1 inputs a high level voltage to a buffer input terminal BIN, a first enabled signal EN1 with a high level is input to a gate electrode of the first buffer transistor M1 through an enabled signal terminal EN, the first buffer transistor M1 is turned on, and the first buffer transistor M1 inputs a high level voltage of the buffer input terminal BIN to the buffer pull-up node BPU; since the first buffer pull-down node BPD1 is connected with the first shift pull-down node SPD1, the first buffer pull-down node BPD1 is also at a low level, the second buffer transistor M2 and the fourth buffer transistor M4 are turned off, and since the second buffer pull-down node BPD2 is at a low level, the fifth buffer transistor M5 and the sixth buffer transistor M6 are turned off; and a buffer clock signal CLKB with a high level is input to a buffer output terminal BOUT_1 through the third buffer transistor M3; Due to the bootstrap effect of the buffer storage capacitor BC, a voltage of a buffer pull-up node BPU_1 is further increased, so that the third buffer transistor M3 is more sufficiently turned on, the buffer clock signal CLKB with a high level is input to the buffer output terminal BOUT_1 through the third buffer transistor M3, and the buffer output terminal BOUT_1 may output the high level signal to a gate line G1 on a display panel. For example, referring to FIG. 9, during a period when the shift register of the first stage has a shift output signal with a high level, buffer clock signals, for example, from the first buffer clock CB1, the second buffer clock CB2, the third buffer clock CB3 and the fourth buffer clock CB4, are sequentially applied to the four buffers connected with the same shift register, respectively, so that the buffers may output the buffer output signals sequentially. Similarly, during a period when a shift register of an odd-numbered stage ((2n−1)th stage, where n is an integer greater than 0) has a shift output signal with a high level, buffer clock signals, for example, from the first buffer clock CB1, the second buffer clock CB2, the third buffer clock CB3 and the fourth buffer clock CB4, are sequentially applied to the four buffers connected with the shift register of the odd-numbered stage, respectively; during a period when a shift register of an even-numbered stage (2n-th stage, where n is an integer greater than 0) has a shift output signal with a high level, buffer clock signals, for example, from the fifth buffer clock CB5, the sixth buffer clock CB6, the seventh buffer clock CB7, and the eighth buffer clock CB8, are sequentially applied to the four buffers connected with the shift register of the even-numbered stage respectively, so that the buffers may output the buffer output signals sequentially. In this way, the first resolution mode is realized.

For example, referring to FIG. 7, FIG. 8 and FIG. 10, a difference between FIG. 10 and FIG. 9 includes, by adjusting time sequences of the first buffer clock CB1, the second buffer clock CB2, the third buffer clock CB3, the fourth buffer clock CB4, the fifth buffer clock CB5, the sixth buffer clock CB6, the seventh buffer clock CB7 and the eighth buffer clock CB8, to make the first buffer clock CB1 and the second buffer clock CB2 have a same time sequence, the third buffer clock CB3 and the fourth buffer clock CB4 have a same time sequence, the fifth buffer clock CB5 and the sixth buffer clock CB6 have a same time sequence, and the seventh buffer clock CB7 and the eighth buffer clock CB8 have a same time sequence. Correspondingly, two adjacent buffers have a same output, so that every two adjacent gate lines in a corresponding display panel may be turned on simultaneously to receive a same data signal. Compared with the case in FIG. 9, resolution in the case of FIG. 10 is reduced to half of that of the case in FIG. 9, that is, a frame frequency of the case in FIG. 10 may be increased by two times compared with that of the case in FIG. 9. In this way, the second resolution mode is realized.

For example, referring to FIG. 7, FIG. 8 and FIG. 11, a difference between FIG. 11 and FIG. 9 includes making the first buffer clock CB1, the second buffer clock CB2, the third buffer clock CB3 and the fourth buffer clock CB4 have a same time sequence, and also making the fifth buffer clock CB5, the sixth buffer clock CB6, the seventh buffer clock CB7 and the eighth buffer clock CB8 have a same time sequence, by adjusting time sequences of the first buffer clock CB1, the second buffer clock CB2, the third buffer clock CB3, the fourth buffer clock CB4, the buffer clock CB5, the sixth buffer clock CB6, the seventh buffer clock CB7 and the eighth buffer clock CB8. Correspondingly, four adjacent buffers have a same output. That is to say, every four adjacent gate lines in the corresponding display panel may be turned on simultaneously to receive the same data signal. Compared with the case in FIG. 9, resolution in the case of FIG. 11 is reduced to one quarter of that of the case in FIG. 9, that is, a frame frequency of the case in FIG. 11 may be increased by four times compared with that of the case in FIG. 9. In this way, the third resolution mode is realized.

For example, selective driving with different resolutions in different regions of the gate driving circuit or the display panel may be implemented. For example, the gate driving circuit or the display panel may be divided into a plurality of different row blocks. According to needs of display content, the first resolution mode may be applied in some row blocks to realize high resolution (e.g., 8K) display, the second resolution mode is applied in some row blocks to realize medium resolution (e.g., UD, 4K) display, thereby taking into account both the resolution and the frame frequency. The third resolution mode is applied in some row blocks to realize low resolution (e.g., FHD, 2K) display, thereby increasing the frame frequency.

It should be noted that, for clarity of description, an underscore and a number following the underscore (e.g., "_1") in the above description denote a shift register of a corresponding stage, a buffer of a corresponding stage or a component thereof. For example, "SPU_1" denotes the first shift pull-up node of the shift register of the first stage; "SOUT_1" denotes the shift output terminal of the shift register of the first stage; and "SPD1_1" denotes the first shift pull-down node of the shift register of the first stage. In the shift-buffer circuit of each stage, a shift register and four buffers are included, "BOUT_1" denotes the buffer output terminal of the first buffer, "BOUT_2" denotes the buffer output terminal of the second buffer, "BOUT_3" denotes the buffer output terminal of the third buffer, and "BOUT_4" denotes the buffer output terminal of the fourth buffer.

Figure 12:
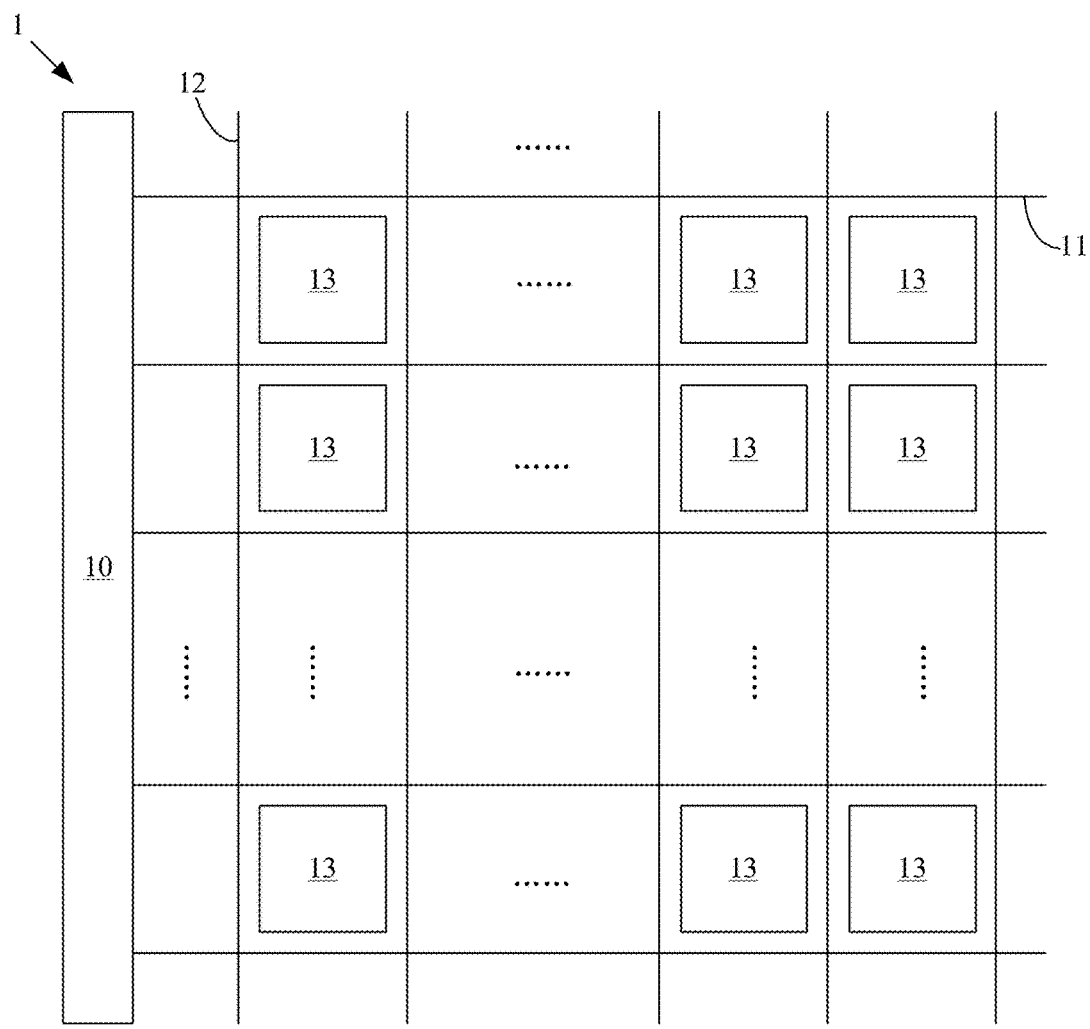
FIG. 12 is a schematic diagram of a display panel provided by an embodiment of the present disclosure.

An embodiment of the present disclosure further provides a display panel 1, as shown in FIG. 12, the display panel 1 comprises the gate driving circuit 10 provided by any embodiment of the present disclosure.

For example, as shown in FIG. 12, the display panel 1 provided by an embodiment of the present disclosure further comprises gate lines 11, data lines 12, and a plurality of pixel units 13 defined by intersecting the gate lines 11 and the data lines 12, and the gate driving circuit 10 is configured to provide gate driving signals to the gate lines.

For example, the gate lines 11 may include the gate lines G1, G2 . . . G4m shown in FIG. 8, each buffer from the buffers BF1, BF2 . . . BF4m is used for outputting a gate driving signal to a corresponding gate line G1, G2 . . . G4m.

Figure 13:
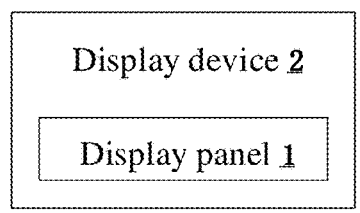
FIG. 13 is a schematic diagram of a display device provided by an embodiment of the present disclosure.

For example, an embodiment of the present disclosure further provides a display device 2, as shown in FIG. 13, and the display device 2 comprises the display panel 1 provided by any embodiment of the present disclosure.

For example, the display device 2 may be any product or component having a display function such as an electronic paper, a cell phone, a tablet computer, a television, a monitor, a notebook computer, a digital photo frame, a navigator and so on.

For example, in at least one embodiment of the present disclosure, the display device 2 may further comprise a signal receiving circuit, a video signal decoding circuit and the like, so as to receive and process the video signal, or may further comprise a modulation and demodulation circuit or an antenna and the like, so as to have signal connection with other equipment through network, wireless signal and the like.

Figure 14:
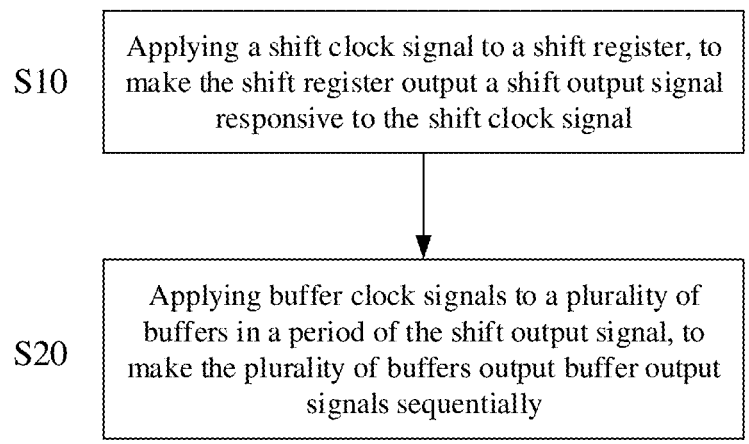
FIG. 14 is a flowchart of a method of driving a shift-buffer circuit provided by an embodiment of the present disclosure.

An embodiment of the present disclosure further provides a method of driving the shift-buffer circuit 100 provided by any embodiment of the present disclosure, and as shown in FIG. 14, the method comprises the following steps:

Step S10: applying the shift clock signal CLKS to the shift register 110, to make the shift register 110 output the shift output signal in response to the shift clock signal CLKS; and Step S20: applying the buffer clock signal CLKB to the plurality of buffers 120 in a period of the shift output signal, to make the plurality of buffers 120 output the buffer output signals sequentially.

For example, in step S10, a shift clock signal CLKS with a high level is applied to the shift register 110, so that the shift register 110 outputs the shift output signal in response to the shift clock signal CLKS with the high level.

For example, in step S20, a buffer clock signal CLKB with a high level is applied to the plurality of buffers 120 in a period of the high-level shift output signal, so that the plurality of buffers 120 output the buffer output signals each with a high level sequentially.

For example, the shift-buffer circuit, the gate driving circuit, the display panel and the driving method provided by the embodiments of the present disclosure may change the display resolution and may perform selective driving in different regions of the display panel.

Although the present disclosure has been described in detail with general description and specific embodiments, it will be apparent to those skilled in the art that the disclosure may be modified or improved based on the embodiments of the disclosure. Therefore, all such modifications or improvements made without departing from the spirit of the present disclosure are all in the scope of the present disclosure.

The disclosure claims the priority of the Chinese Patent Application No. 201710218273.7 filed on Apr. 5, 2017, which is incorporated herein by reference in its entirety as part of the disclosure of the present application.

The invention claimed is:

1. A shift-buffer circuit, comprising: a shift register and a plurality of buffers connected with the shift register, wherein:

the shift register comprises a shift output terminal;
the shift register is configured to output a shift output signal from the shift output terminal, in response to a shift clock signal;
each of the buffers comprises a buffer input terminal and a buffer output terminal, the buffer input terminal being connected with the shift output terminal; and
each of the buffers is configured to output a buffer output signal from the buffer output terminal, in response to a buffer clock signal,
wherein each of the buffers comprises:
a buffer input circuit, connected with the buffer input terminal and a buffer pull-up node respectively;
a first buffer reset circuit, connected with the buffer pull-up node, a first buffer pull-down node and a second power supply terminal respectively;
a buffer output circuit, connected with the buffer pull-up node, a buffer clock signal terminal and the buffer output terminal respectively;
a first buffer output pull-down circuit, connected with the buffer output terminal, the first buffer pull-down node and the second power supply terminal respectively; and
a buffer storage capacitor, connected with the buffer pull-up node and the buffer output terminal respectively.

2. The shift-buffer circuit according to claim 1, wherein the shift register comprises:
a shift input circuit, connected with a shift input terminal and a shift pull-up node respectively;
a first shift reset circuit, connected with the shift pull-up node, a first shift pull-down node, and a first power supply terminal respectively;
a shift output circuit, connected with the shift pull-up node, a shift clock signal terminal and the shift output terminal respectively;
a first shift output pull-down circuit, connected with the shift output terminal, the first shift pull-down node and the first power supply terminal respectively;
a first pull-down node control circuit, connected with the first shift pull-down node, a first power signal terminal and the first power supply terminal respectively; and
a shift storage capacitor, connected with the shift pull-up node and the shift output terminal respectively.

3. The shift-buffer circuit according to claim 2, wherein the second power supply terminal is connected with the first power supply terminal, and the first buffer pull-down node is connected with the first shift pull-down node.

4. The shift-buffer circuit according to claim 3, wherein:
the shift input circuit comprises a first shift transistor, a first electrode of the first shift transistor being connected with the shift input terminal, a gate electrode of the first shift transistor being connected with the shift input terminal, and a second electrode of the first shift transistor being connected with the shift pull-up node;
the first shift reset circuit comprises a second shift transistor, a first electrode of the second shift transistor being connected with the shift pull-up node, a gate electrode of the second shift transistor being connected with the first shift pull-down node, and a second electrode of the second shift transistor being connected with the first power supply terminal;
the shift output circuit comprises a third shift transistor, a first electrode of the third shift transistor being connected with the shift clock signal terminal, a gate electrode of the third shift transistor being connected with the shift pull-up node, and a second electrode of the third shift transistor being connected with the shift output terminal;
the first shift output pull-down circuit comprises a fourth shift transistor, a first electrode of the fourth shift transistor being connected with the shift output terminal, a gate electrode of the fourth shift transistor being connected with the first shift pull-down node, and a second electrode of the fourth shift transistor being connected with the first power supply terminal;
the first pull-down node control circuit comprises a fifth shift transistor and a sixth shift transistor, a first electrode of the fifth shift transistor being connected with the first power signal terminal, a gate electrode of the fifth transistor being connected with the first power signal terminal, a second electrode of the fifth shift transistor being connected with the first shift pull-down node, a first electrode of the sixth shift transistor being connected with the first shift pull-down node, a gate electrode of the sixth shift transistor being connected with the shift pull-up node, and a second electrode of the sixth shift transistor being connected with the first power supply terminal; and
a first terminal of the shift storage capacitor is connected with the shift pull-up node, and a second terminal of the shift storage capacitor is connected with the shift output terminal.

5. The shift-buffer circuit according to claim 3, wherein:
the buffer input circuit comprises a first buffer transistor, a first electrode of the first buffer transistor being connected with the buffer input terminal, a gate electrode of the first buffer transistor being connected with an enabled signal terminal, and a second electrode of the first buffer transistor being connected with the buffer pull-up node;
the first buffer reset circuit comprises a second buffer transistor, a first electrode of the second buffer transistor being connected with the buffer pull-up node, a gate electrode of the second buffer transistor being connected with the first buffer pull-down node, and a second electrode of the second buffer transistor being connected with the second power supply terminal;
the buffer output circuit comprises a third buffer transistor, a first electrode of the third buffer transistor being connected with the buffer clock signal terminal, a gate electrode of the third buffer transistor being connected with the buffer pull-up node, and a second electrode of the third buffer transistor being connected with the buffer output terminal;
the first buffer output pull-down circuit comprises a fourth buffer transistor, a first electrode of the fourth buffer transistor being connected with the buffer output terminal, a gate electrode of the fourth buffer transistor being connected with the first buffer pull-down node, and a second electrode of the fourth buffer transistor being connected with the second power supply terminal; and
a first terminal of the buffer storage capacitor is connected with the buffer pull-up node, and a second terminal of the buffer storage capacitor is connected with the buffer output terminal.

6. The shift-buffer circuit according to claim 3, wherein:
the shift register further comprises:
a second shift reset circuit, connected with the shift pull-up node, a second shift pull-down node and a first power supply terminal respectively;

a second shift output pull-down circuit, connected with the shift output terminal, the second shift pull-down node and the first power supply terminal respectively; and a second pull-down node control circuit, connected with the second shift pull-down node, a second power signal terminal and the first power supply terminal respectively; and each of the buffers further comprises:

a second buffer reset circuit, connected with the buffer pull-up node, a second buffer pull-down node and the second power supply terminal respectively; and a second buffer output pull-down circuit, connected with the buffer output terminal, the second buffer pull-down node and the second power supply terminal respectively, wherein a first power signal provided by the first power signal terminal and a second power signal provided by the second power signal terminal are mutually reverse signals.

7. The shift-buffer circuit according to claim 2, wherein:

the shift input circuit comprises a first shift transistor, a first electrode of the first shift transistor being connected with the shift input terminal, a gate electrode of the first shift transistor being connected with the shift input terminal, and a second electrode of the first shift transistor being connected with the shift pull-up node;

the first shift reset circuit comprises a second shift transistor, a first electrode of the second shift transistor being connected with the shift pull-up node, a gate electrode of the second shift transistor being connected with the first shift pull-down node, and a second electrode of the second shift transistor being connected with the first power supply terminal;

the shift output circuit comprises a third shift transistor, a first electrode of the third shift transistor being connected with the shift clock signal terminal, a gate electrode of the third shift transistor being connected with the shift pull-up node, and a second electrode of the third shift transistor being connected with the shift output terminal;

the first shift output pull-down circuit comprises a fourth shift transistor, a first electrode of the fourth shift transistor being connected with the shift output terminal, a gate electrode of the fourth shift transistor being connected with the first shift pull-down node, and a second electrode of the fourth shift transistor being connected with the first power supply terminal;

the first pull-down node control circuit comprises a fifth shift transistor and a sixth shift transistor, a first electrode of the fifth shift transistor being connected with the first power signal terminal, a gate electrode of the fifth transistor being connected with the first power signal terminal, a second electrode of the fifth shift transistor being connected with the first shift pull-down node, a first electrode of the sixth shift transistor being connected with the first shift pull-down node, a gate electrode of the sixth shift transistor being connected with the shift pull-up node, and a second electrode of the sixth shift transistor being connected with the first power supply terminal; and a first terminal of the shift storage capacitor is connected with the shift pull-up node, and a second terminal of the shift storage capacitor is connected with the shift output terminal.

8. The shift-buffer circuit according to claim 2, wherein:

the shift register further comprises:

a second shift reset circuit, connected with the shift pull-up node, a second shift pull-down node and a first power supply terminal respectively;

a second shift output pull-down circuit, connected with the shift output terminal, the second shift pull-down node and the first power supply terminal respectively; and a second pull-down node control circuit, connected with the second shift pull-down node, a second power signal terminal and the first power supply terminal respectively; and each of the buffers further comprises:

a second buffer reset circuit, connected with the buffer pull-up node, a second buffer pull-down node and the second power supply terminal respectively; and a second buffer output pull-down circuit, connected with the buffer output terminal, the second buffer pull-down node and the second power supply terminal respectively, wherein a first power signal provided by the first power signal terminal and a second power signal provided by the second power signal terminal are mutually reverse signals.

9. The shift-buffer circuit according to claim 8, wherein:

the second shift reset circuit comprises a seventh shift transistor, a first electrode of the seventh shift transistor being connected with the shift pull-up node, a gate electrode of the seventh shift transistor being connected with the second shift pull-down node, and a second electrode of the seventh shift transistor being connected with the first power supply terminal;

the second shift output pull-down circuit comprises an eighth shift transistor, a first electrode of the eighth shift transistor being connected with the shift output terminal, a gate electrode of the eighth shift transistor being connected with the second shift pull-down node, and a second electrode of the eighth shift transistor being connected with the first power supply terminal;

the second pull-down node control circuit comprises a ninth shift transistor and a tenth shift transistor, a first electrode of the ninth shift transistor being connected with the second power signal terminal, a gate electrode of the ninth shift transistor being connected with the second power signal terminal, a second electrode of the ninth shift transistor being connected with the second shift pull-down node, a first electrode of the tenth shift transistor being connected with the second shift pull-down node, a gate electrode of the tenth shift transistor being connected with the shift pull-up node, and a second electrode of the tenth shift transistor being connected with the first power supply terminal;

the second buffer reset circuit comprises a fifth buffer transistor, a first electrode of the fifth buffer transistor being connected with the buffer pull-up node, a gate electrode of the fifth buffer transistor being connected with the second buffer pull-down node, and a second electrode of the fifth buffer transistor being connected with the second power supply terminal; and the second buffer output pull-down circuit comprises a sixth buffer transistor, a first electrode of the sixth buffer transistor being connected with the buffer output terminal, a gate electrode of the sixth buffer transistor being connected with the second buffer pull-down node, and a second electrode of the sixth buffer transistor being connected with the second power supply terminal.

10. The shift-buffer circuit according to claim 8, wherein the second buffer pull-down node is connected with the second shift pull-down node.

11. The shift-buffer circuit according to claim 1, wherein:
the buffer input circuit comprises a first buffer transistor, a first electrode of the first buffer transistor being connected with the buffer input terminal, a gate electrode of the first buffer transistor being connected with an enabled signal terminal, and a second electrode of the first buffer transistor being connected with the buffer pull-up node;
the first buffer reset circuit comprises a second buffer transistor, a first electrode of the second buffer transistor being connected with the buffer pull-up node, a gate electrode of the second buffer transistor being connected with the first buffer pull-down node, and a second electrode of the second buffer transistor being connected with the second power supply terminal;
the buffer output circuit comprises a third buffer transistor, a first electrode of the third buffer transistor being connected with the buffer clock signal terminal, a gate electrode of the third buffer transistor being connected with the buffer pull-up node, and a second electrode of the third buffer transistor being connected with the buffer output terminal;
the first buffer output pull-down circuit comprises a fourth buffer transistor, a first electrode of the fourth buffer transistor being connected with the buffer output terminal, a gate electrode of the fourth buffer transistor being connected with the first buffer pull-down node, and a second electrode of the fourth buffer transistor being connected with the second power supply terminal; and
a first terminal of the buffer storage capacitor is connected with the buffer pull-up node, and a second terminal of the buffer storage capacitor is connected with the buffer output terminal.

12. The shift-buffer circuit according to claim 1, wherein each of the shift registers is connected with four of the buffers.

13. A gate driving circuit, comprising shift-buffer circuits in a plurality of stages, wherein a shift-buffer circuit of each stage comprises the shift-buffer circuit according to claim 1.

14. The gate driving circuit according to claim 13, wherein:
a shift output terminal of a shift register in a shift-buffer circuit of a (2n−1)-th stage is connected with a shift input terminal of a shift register in a shift-buffer circuit of a (2n+1)-th stage; and
a shift output terminal of a shift register in a shift-buffer circuit of a 2n-th stage is connected with a shift input terminal of a shift register in a shift-buffer circuit of a (2n+2)-th stage,
where n is an integer greater than zero.

15. The gate driving circuit according to claim 14, wherein:
an enabled signal terminal of a buffer in the shift-buffer circuit of the (2n−1)-th stage is configured to receive a first enabled signal; and
an enabled signal terminal of a buffer in the shift-buffer circuit of the 2n-th stage is configured to receive a second enabled signal.

16. A display panel, comprising the gate driving circuit according to claim 13.

17. A display device, comprising the display panel according to claim 16.

18. A method of driving the shift-buffer circuit according to claim 1, comprising:
applying a shift clock signal to a shift register, to make the shift register output a shift output signal in response to the shift clock signal; and
applying buffer clock signals to a plurality of buffers in a period of the shift output signal, to make the plurality of buffers output buffer output signals sequentially.

* * * * *